(12) United States Patent
Miyake et al.

(10) Patent No.: US 9,034,567 B2
(45) Date of Patent: May 19, 2015

(54) METHOD FOR MANUFACTURING LIQUID CRYSTAL DISPLAY DEVICE, AND LIQUID CRYSTAL DISPLAY DEVICE

(71) Applicants: Sharp Kabushiki Kaisha, Osaka-shi, Osaka (JP); JNC CORPORATION, Chiyoda-ku, Tokyo (JP)

(72) Inventors: Isamu Miyake, Osaka (JP); Hiroaki Asagi, Osaka (JP); Toshihiro Matsumoto, Osaka (JP); Koichi Miyachi, Osaka (JP); Youichiro Ooki, Ichihara (JP); Fumitaka Kondo, Ichihara (JP)

(73) Assignees: Sharp Kabushiki Kaisha, Osaka (JP); JNC Corporation, Tokyo (JP)

( * ) Notice: Subject to any disclaimer, the term of this patent is extended or adjusted under 35 U.S.C. 154(b) by 0 days.

(21) Appl. No.: 14/464,732

(22) Filed: Aug. 21, 2014

(65) Prior Publication Data

US 2015/0056544 A1    Feb. 26, 2015

(30) Foreign Application Priority Data

Aug. 21, 2013   (JP) .................................. 2013-171373

(51) Int. Cl.
  *G03F 7/20*    (2006.01)
  *G03F 7/26*    (2006.01)
  *G02F 1/1337*  (2006.01)

(52) U.S. Cl.
  CPC .. *G03F 7/26* (2013.01); *G03F 7/20* (2013.01); *G02F 1/133723* (2013.01); *G02F 1/133788* (2013.01)

(58) Field of Classification Search
  CPC ....... G03F 7/20; G03F 7/26; G02F 1/133723; G02F 1/133788

USPC ........................... 430/321, 330; 349/124, 135
See application file for complete search history.

(56) References Cited

U.S. PATENT DOCUMENTS

2007/0128378 A1*  6/2007  Kim et al. ....................... 428/1.2
2007/0232780 A1* 10/2007  Tamura ........................... 528/310
2010/0297367 A1* 11/2010  Hirai et al. ..................... 428/1.2

FOREIGN PATENT DOCUMENTS

JP      08-179328 A     7/1996
JP      4459417 B2      4/2010

OTHER PUBLICATIONS

Sakamoto et al., "In-Plane Molecular Order of a Photo-Oriented Polyamic Acid Film: Enhancement Upon Thermal Imidization", Molecular Crystals and Liquid Crystals, vol. 412, 2004, pp. 293-299.

*Primary Examiner* — John A McPherson
(74) *Attorney, Agent, or Firm* — Keating & Bennett, LLP

(57) ABSTRACT

Provided is a method for manufacturing a liquid crystal display device that includes a photoalignment film. The photoalignment film is formed from a liquid crystal alignment agent, and aligns liquid crystal molecules horizontally to the main face of the at least one of the substrates. The liquid crystal alignment agent contains a solvent and at least two kinds of polyamic acids or their derivatives obtained by reacting diamine and tetracarboxylic dianhydride. At least two of the diamines and at least one of the tetracarboxylic dianhydrides are compounds represented by predetermined formulas. The method includes the steps of: (1) forming the film of the liquid crystal alignment agent; (2) pre-baking the film; (3) irradiating the pre-baked film with light; and (4) post-baking the irradiated film, the step (4) including an operation of post-baking the film multiple times at temperatures ranging from low to high temperatures.

15 Claims, 11 Drawing Sheets

METHOD FOR MANUFACTURING LIQUID CRYSTAL DISPLAY DEVICE, AND LIQUID CRYSTAL DISPLAY DEVICE

TECHNICAL FIELD

The present invention relates to a method for manufacturing a liquid crystal display device, and a liquid crystal display device. More specifically, the present invention relates to a method for manufacturing a liquid crystal display device specifying the conditions for forming an alignment film, and to a liquid crystal display device manufactured by the above method.

BACKGROUND ART

A liquid crystal display device includes a pair of substrates (e.g. glass substrates) between which a liquid crystal display element is sandwiched. Such a liquid crystal display device characteristically has a thin profile, a light weight, and a low power consumption, and is indispensable in everyday life and business as a display of devices such as mobile devices, various monitors, and televisions. Liquid crystal display devices have been widely used in recent years for devices such as electronic books, digital photo frames, industrial appliances (IAs), personal computers (PCs), tablet PCs, and smartphones. For these uses requiring various performances, various liquid crystal display modes have been developed.

Liquid crystal display modes commonly used in recent years are, for example, the vertical alignment (VA) mode which aligns liquid crystal molecules, having negative anisotropy of dielectric constant, vertically to the main faces of the substrates; and the in-plane switching (IPS) mode and the fringe field switching (FFS) mode each of which aligns liquid crystal molecules having positive or negative anisotropy of dielectric constant horizontally to the main faces of the substrates.

For alignment of the liquid crystal molecules, an alignment film is used on which an alignment treatment has been performed by, for example, rubbing or photoalignment treatment. Especially the photoalignment treatment has been noted in these years as a technique for obtaining a liquid crystal display device that provides excellent viewing angle characteristics. The photoalignment treatment is a method of providing alignment controlling force to the alignment film by utilizing a photoactive material as the material of the alignment film, and irradiating the formed film with light such as ultraviolet light. The photoalignment treatment enables control of the alignment directions for the liquid crystal molecules to multiple directions when a voltage is applied, without performing the rubbing treatment to the alignment film, which leads to excellent viewing angle characteristics. Also, the photoalignment treatment also enables contactless alignment treatment on the surface of the alignment film unlike the rubbing treatment, thereby preventing generation of contamination and dirt during the treatment.

Patent Literature 1 and Patent Literature 2 disclose an alignment treatment of generating a uniform alignment controlling force to prevent display failure. Also, Non Patent Literature 1, for example, discloses increasing the degree of alignment of polymers by the post-baking step involved in the process of forming an alignment film.

CITATION LIST

Patent Literature

Patent Literature 1: JP H08-179328 A
Patent Literature 2: JP 4459417 B

Non Patent Literature

Non Patent Literature 1: K. Sakamoto et al., "In-plane Molecular Order of a Photo-oriented Polyamic Acid Film: Enhancement upon Thermal Imidization", Molecular Crystals and Liquid Crystals, 2004, Vol. 412, p.293-299

SUMMARY OF INVENTION

Technical Problem

As described above, alignment treatment for an alignment film formed by photoalignment treatment (hereinafter, such a film is also referred to as a photoalignment film) has been studied. When liquid crystal display devices in a liquid crystal display mode of the IPS mode or the FFS mode were produced by photoalignment treatment using a polyimide alignment film containing azobenzene in the main chain, the produced devices sometimes caused light leakage during black display and showed a decreased contrast. This phenomenon did not occur in liquid crystal display devices of other combinations, i.e. liquid crystal display devices in a liquid crystal display mode of the vertical alignment mode (e.g. VA mode) produced by photoalignment treatment using a polyimide alignment film containing azobenzene in the main chain.

The present inventors have studied the causes for the phenomenon, and have found that the phenomenon is due to alignment disorder of the liquid crystal molecules caused by the insufficient increase in the degree of alignment of polymers contained in the alignment film (hereinafter, these polymers are also referred to simply as polymers) even after performing the photoalignment treatment. The degree of alignment indicates the degree of anisotropy of polymers to which the photoalignment treatment has been performed for alignment in a predetermined direction. The degree of anisotropy can be measured by, for example, refractive index anisotropy and absorption anisotropy.

Patent Literature 1 states that it provides a method for manufacturing a liquid crystal alignment film and a method for manufacturing a liquid crystal element which can achieve uniform alignment by a uniform high pretilt when chiral smectic liquid crystals are aligned by an alignment film, and thereby prevent display failure due to liquid crystals. The invention of Patent Literature 1, however, aligns the chiral smectic liquid crystals by rubbing treatment, which means that the invention can be further improved in terms of solving the above problem. Also, the invention of Patent Literature 1 is for increasing the alignment uniformity provided by alignment films, and thus is essentially different in the problem to be solved from the present invention which is for increasing the degree of alignment of polymers.

Patent Literature 2 states that it provides a liquid crystal alignment treatment method and a liquid crystal display element which can achieve a pretilt angle of liquid crystals required for liquid crystal alignment elements without irradiation in the oblique direction. Patent Literature 2, however, does not disclose anything about IPS-mode or FFS-mode liquid crystal display devices, and can still be improved in terms of solving the above problem.

Non-Patent Literature 1 states that when the degree of alignment of a polyimide alignment film containing azobenzene in the main chain was measured, the degree of alignment after the post-baking was higher than that before the post-baking. Non-Patent Literature 1, however, merely teaches the post-baking conditions of 250° C. and one hour, and therefore the invention can still be improved in terms of optimization of the post-baking conditions. Also, Non-Patent Literature 1 fails to teach pre-baking. Without pre-baking, the thickness of the photoalignment film becomes non-uniform, which decreases display qualities.

The present invention has been made in view of the above current state of the art. The object of the present invention is to provide a method for manufacturing a liquid crystal display device that includes a photoalignment film and can sufficiently improve the display qualities; and a liquid crystal display device manufactured by the above method.

Solution to Problem

The present inventors have made various studies on the reasons for the insufficient increase in the degree of alignment of polymers. As a result, the inventors have found that, when the post-baking temperature is increased immediately to a temperature at which the polymers are sufficiently imidized, the degree of alignment of polymers is fixed before it becomes sufficiently high. Since the polymers cannot be completely aligned by photoirradiation, polymers right after the photoalignment treatment include those oriented to directions different from the predetermined alignment direction, which means that the degree of alignment of polymers has not become sufficiently high. Hence, the above phenomenon occurs probably because the polymers of which the degree of alignment has not become sufficiently high are imidized, and thus the degree of alignment is fixed before the degree of alignment becomes sufficiently high. This may be also because imidized polymers are rigid and thus have low thermal mobility (hereinafter, also referred to simply as mobility), which makes it difficult for the polymers, oriented to directions different from the predetermined alignment direction as described above, to be reoriented to the alignment direction.

The present inventors have therefore made various studies on the method for manufacturing a liquid crystal display device including a photoalignment film and capable of sufficiently improving display qualities, and have focused on the operation of post-baking multiple times at temperatures ranging from low to high temperatures in the post-baking step. They have found that polymers show increased mobility at temperatures where the imidization of polymers does not sufficiently proceeds, and the polymers are more likely to be oriented in the alignment direction provided by the photoalignment treatment. As a result, the inventors have found that a high degree of alignment of polymers and optimization of the temperature profile for the post-baking lead to a liquid crystal display device including a photoalignment film and capable of sufficiently improving display qualities. Thereby, the above problems have been solved, and thus the present invention has been completed.

That is, one aspect of the present invention may be a method for manufacturing a liquid crystal display device, the liquid crystal display device including a pair of substrates and a photoalignment film disposed on at least one of the substrates, the photoalignment film formed from a liquid crystal alignment agent, and aligning liquid crystal molecules horizontally to the main face of the at least one of the substrates, the liquid crystal alignment agent containing a solvent and at least two kinds of polyamic acids or their derivatives, the at least two kinds of polyamic acids or their derivatives including a compound obtained by reacting at least a diamine represented by the following chemical formula (1-1) and a first tetracarboxylic dianhydride, and a compound obtained by reacting at least a diamine represented by the following chemical formula (1-2) and a second tetracarboxylic dianhydride, at least one of the first and second tetracarboxylic dianhydrides being a compound represented by the following chemical formula (2), the method including, in the following order, the steps of: (1) forming the film of the liquid crystal alignment agent on the at least one of the substrates; (2) pre-baking the film of the liquid crystal alignment agent formed on the at least one of the substrates; (3) irradiating the pre-baked film of the liquid crystal alignment agent with light; and (4) post-baking the irradiated film of the liquid crystal alignment agent, the step (4) including an operation of post-baking the film of the liquid crystal alignment agent multiple times at temperatures ranging from low to high temperatures.

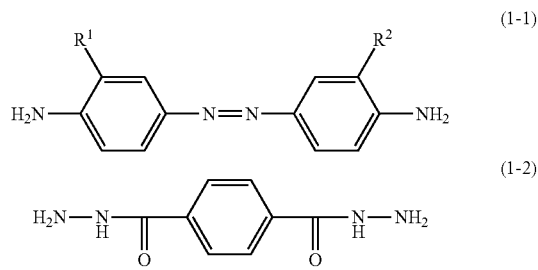

In the formula, $R^1$ and $R^2$ are each independently —$CH_3$ or a hydrogen atom.

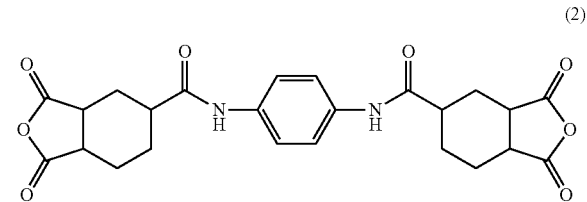 [SMILES: O=C(Nc1ccc(NC(=O)C2CCC3C(=O)OC(=O)C3C2)cc1)C1CCC2C(=O)OC(=O)C2C1]

The method for manufacturing a liquid crystal display device according to one aspect of the present invention is not particularly limited by the other steps.

Another aspect of the present invention may be a liquid crystal display device in a liquid crystal display mode of the IPS mode or the FFS mode, the device manufactured by the above method for manufacturing a liquid crystal display device.

The configurations of the liquid crystal display device according to another aspect of the present invention are not especially limited by other components, and other configurations usually used in liquid crystal display devices may appropriately be applied.

Advantageous Effects of Invention

The present invention can provide a method for manufacturing a liquid crystal display device that includes a photoalignment film and can sufficiently improve display qualities,

DESCRIPTION OF EMBODIMENTS

Figure 1:
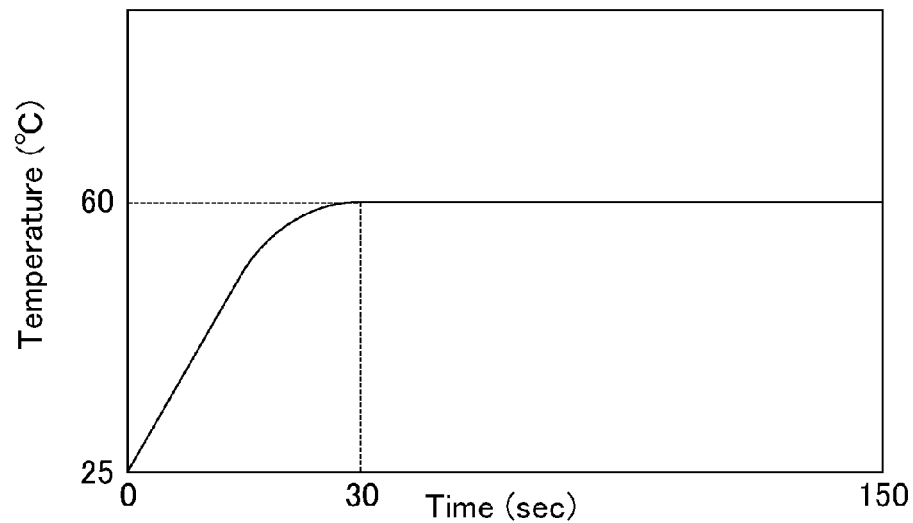
FIG. 1 is a graph showing a temperature profile for pre-baking in Example 1.

The method for manufacturing a liquid crystal display device of the present invention utilizes a liquid crystal alignment agent having a certain composition. The liquid crystal alignment agent contains, in the polymer solids content, [A] a polyamic acid or its derivative obtained by reacting at least a diamine represented by the above chemical formula (1-1) and a first tetracarboxylic dianhydride, and [B] a polyamic acid or its derivative obtained by reacting at least a diamine represented by the above chemical formula (1-2) and a second tetracarboxylic dianhydride. At least one of the first and second tetracarboxylic dianhydrides is a compound represented by the above chemical formula (2). A "polymer" herein corresponds to the above at least two kinds of polyamic acids or their derivatives.

The liquid crystal alignment agent may further contain, in the polymer solids content, [C] a polyamic acid or its derivative obtained by reacting at least one diamine selected from the group consisting of the compounds represented by the following chemical formulas (3-1) to (3-9) and at least one tetracarboxylic dianhydride selected from the group consisting of the compounds represented by the following chemical formulas (4-1) to (4-6). The diamines represented by the following chemical formulas (3-1) to (3-9) and the tetracarboxylic dianhydrides represented by the following chemical formulas (4-1) to (4-6) are preferred from the viewpoints of easy availability, easiness in the polymer production, and electric characteristics.

(3-1)

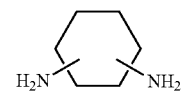
(3-2)

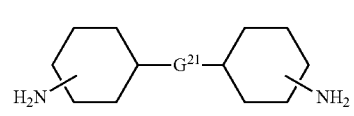
(3-3)

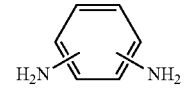
(3-4)

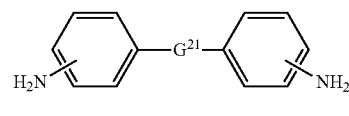
(3-5)

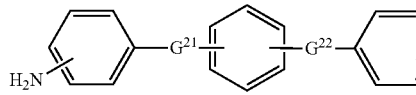
(3-6)

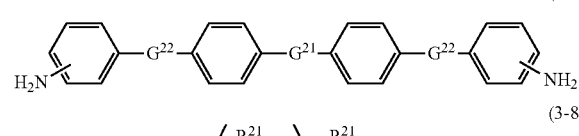
(3-7)

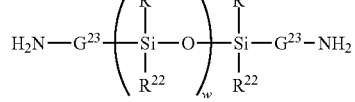
(3-8)

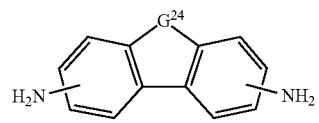
(3-9)

In the above chemical formulas (3-1) to (3-9), m is an integer of any of 1 to 12. $G^{21}$ is independently a single bond, —O—, —S—, —S—S—, —SO$_2$—, —CO—, —CONH—, —NHCO—, —C(CH$_3$)$_2$—, —C(CF$_3$)$_2$—, —(CH$_2$)$_{m'}$—, —O—(CH$_2$)$_{m'}$—O—, or —S—(CH$_2$)$_{m'}$—S—, and m' is independently an integer of any of 1 to 12. $G^{22}$ is independently a single bond, —O—, —S—, —CO—, —C(CH$_3$)$_2$—, —C(CF$_3$)$_2$—, or a C1-C10 alkylene. Any —H in the cyclohexane ring or the benzene ring in the chemical formulas may be replaced by —F, —CH$_3$, —OH, —CF$_3$, or benzyl. A group not bonded to any of the carbon atoms constituting the ring can be bonded to the ring at any position. Also, —NH$_2$ is bonded to the cyclohexane ring or benzene ring at any position except for the position to which $G^{21}$ or $G^{22}$ is bonded. $G^{23}$s are each independently a C1-C6 alkylene, phenylene, or alkyl-substituted phenylene, and w is an integer of any of 1 to 10. $G^{24}$ is —$CH_2$— or —NH—. $R^{21}$ and $R^{22}$ are each independently a C1-C3 alkyl or phenyl.

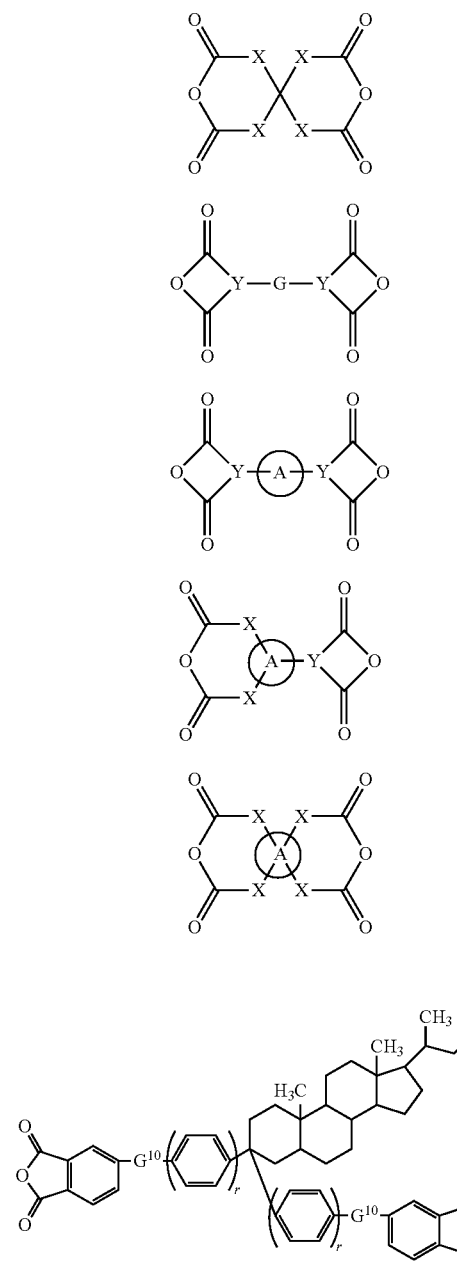

In the above chemical formulas (4-1), (4-4), and (4-5), Xs are each independently a single bond or —$CH_2$.

In the above chemical formula (4-2), G is a single bond, a C1-C20 alkylene, —CO—, —O—, —S—, —$SO_2$—, —$C(CH_3)_2$—, or —$C(CF_3)_2$—.

In the above chemical formulas (4-2) to (4-4), Ys are each independently one selected from the group consisting of trivalent groups represented by the following chemical formula (5), and any hydrogen in these groups may be replaced by methyl, ethyl, or phenyl.

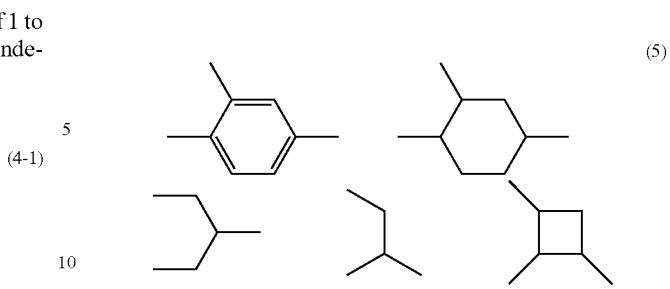

In the above formulas (4-3) to (4-5), the ring A is a C3-C10 monocyclic hydrocarbon group or a C6-C30 condensed polycyclic hydrocarbon group. Any hydrogen in the groups may be replaced by methyl, ethyl, or phenyl. The bond of the ring is linked to any carbon constituting the ring, and two bonds may be linked to the same carbon atom.

In the above formula (4-6), $G^{10}$s are each independently —O—, —COO—, or —OCO—, and r's are each independently 0 or 1.

The liquid crystal alignment agent can be formed into a photoalignment film. The photoalignment film aligns the liquid crystal molecules horizontally to the main face of at least one of the substrates (hereinafter, the film is also referred to as a horizontal photoalignment film). The horizontal photoalignment film may be any film that aligns at least the liquid crystal molecules near the film substantially horizontally to the face of the horizontal photoalignment film. That is, in one suitable embodiment, the horizontal photoalignment film is a photoalignment film that is used for a liquid crystal display device of an IPS-mode or FFS-mode. Here, to "align substantially horizontally" means, for example, aligning the liquid crystal molecules preferably at a pretilt angle of 15° or smaller, and more preferably at 1° or smaller to the face of the horizontal photoalignment film.

The method for manufacturing a liquid crystal display device of the present invention includes the above steps (1) to (4) using the above liquid crystal alignment agent. The above step (1) (hereinafter, the step is also referred to as a step of forming a film of a liquid crystal alignment agent) is performed by, for example, the application methods (e.g. ink jetting, spin coating) or a printing (transfer) method by the flexo printing, and may form a film on the at least one of the substrates from the liquid crystal alignment agent so that the resulting film is capable of functioning as a photoalignment film in the following steps. The film formation conditions may be appropriately determined based on, for example, the film formation method. The other conditions (e.g. the film thickness) may also be made the same as the conditions (the film thickness) for a photoalignment film usually set. The at least one of the substrates may also be any substrate on which treatment for photoalignment film formation is performed, and may be a substrate on which various treatments have been performed.

The above step (2) (hereinafter, also referred to as a pre-baking step) heats/dries the film of the liquid crystal alignment agent so as to evaporate the solvent, for example. Here, the pre-baking step may remove the solvent partly or substantially completely. The pre-baking step is performed using, for example, a heating device set to a predetermined temperature, such as a hot plate and a circulating hot air oven.

The above step (3) (hereinafter, also referred to as a photoirradiation step) performs a photoalignment treatment on the pre-baked film of the liquid crystal alignment agent by, for example, ultraviolet light, visible light, or both of the lights. Here, polarized ultraviolet light is suitable.

The above step (4) (hereinafter, also referred to as a post-baking step) imidizes the polymers or volatilizes the residual solvent, for example. The post-baking step is performed using, for example, a heating device set at a predetermined temperature, such as a hot plate and a circulating hot air oven.

Here, "the step (4) baking including an operation of post-baking the film of the liquid crystal alignment agent multiple times at temperatures ranging from low to high temperatures" means that, for example, performing the post-baking with a deliberately manipulated temperature profile, such as performing the post-baking in a stepwise manner in order to have a plurality of periods of different constant temperatures during the heating, and changing the temperature increase rate multiple times. This is not post-baking the substrate on which the film of a liquid crystal alignment agent is formed with a temperature profile generated naturally as a result of heating using a heating device set at a predetermined temperature, such as a hot plate, by one operation without any manipulation during the heating.

The temperature conditions in the steps (2) and (4), for example the highest target temperature in pre-baking and post-baking, can be the conditions set for preparation of a typical photoalignment film. Also, the photoirradiation conditions in the step (3) can be the conditions set for preparation of a typical photoalignment film.

The present invention will be described in more detail below with reference to the drawings based on examples which, however, are not intended to limit the scope of the present invention. The configurations in the following examples may be appropriately combined or changed as long as the combination does not go beyond the scope of the present invention.

Example 1

Example 1 is the case where the post-baking was performed in two steps at two different temperatures. The method for manufacturing a liquid crystal display device according to Example 1 is described in the order of the steps in the following.
(Preparation of Substrate) A glass substrate having an FFS-mode electrode structure was used. For the counter substrate that faces the glass substrate, a bare glass substrate was used.
(Liquid Crystal Alignment Agent)
The polymer solids content used contained the compounds [A] and [B], and at least one kind of the above compounds [C]. In the present examples, the first and second tetracarboxylic dianhydrides are each a tetracarboxylic dianhydride represented by the above chemical formula (2). The solvent used was a mixture of N-methyl-pyrrolidone and butyl cellosolve. The polymer solids concentration was 3% by weight, N-methyl-pyrrolidone concentration was 67% by weight, and butyl cellosolve concentration was 30% by weight.
(Step of Forming a Film of a Liquid Crystal Alignment Agent)
The liquid crystal alignment agent was applied to two substrates by spin coating, so that a film of the liquid crystal alignment agent was formed on each substrate.
(Pre-Baking Step)
The film of the liquid crystal alignment agent on each of the two substrates was pre-baked with a temperature profile as illustrated in FIG. 1. FIG. 1 is a graph showing a temperature profile for pre-baking in Example 1. The substrates were placed on a 60° C. hot plate. As shown in FIG. 1, the temperature of the substrates increased from room temperature (25° C.) to 60° C. over 30 seconds, and then pre-baking was performed at 60° C. for 120 seconds. The hot plate used was a hot plate from AS ONE Corp. (product name: EC-1200N).

Figure 2:
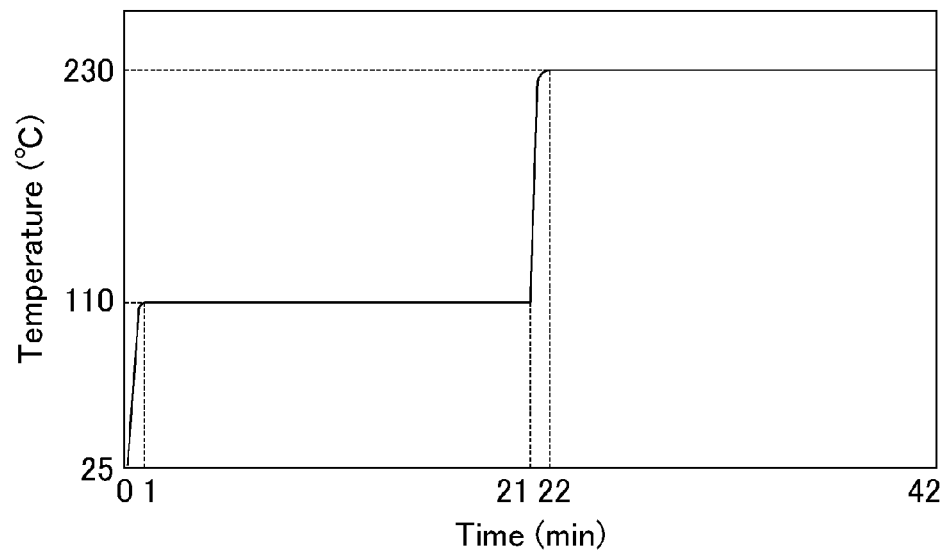
FIG. 2 is a graph showing a temperature profile for post-baking in Example 1.

The thickness of the film of the liquid crystal alignment agent after the pre-baking step was about 100 nm.
(Photoirradiation Step)
The pre-baked film of the liquid crystal alignment agent on each of the two substrates was irradiated with linearly polarized ultraviolet light having a wavelength of 365 nm. The degree of polarization for the linearly polarized ultraviolet light was 30:1 at a wavelength of 365 nm. The irradiation with the linearly polarized ultraviolet light was performed from the normal direction to the substrates, and the irradiation amount thereof was 1000 mJ/cm$^2$ at a wavelength of 365 nm. The angle formed by the extension direction of the slits of the pixel electrodes on the glass substrate and the polarization direction of the linearly polarized ultraviolet light was 10°.
(Post-Baking Step)
The irradiated film of the liquid crystal alignment agent on each of the two substrates was post-baked with a temperature profile as shown in FIG. 2. FIG. 2 is a graph showing a temperature profile for post-baking in Example 1. The substrates were placed on a 110° C. hot plate. As shown in FIG. 2, the temperature of the substrates increased from room temperature (25° C.) to 110° C. over 1 minute, and then the first post-baking was performed at 110° C. for 20 minutes. Next, the substrates were placed on a separately prepared 230° C. hot plate. As shown in FIG. 2, the temperature of the substrates increased from 110° C. to 230° C. over 1 minute. Then the second post-baking was performed at 230° C. for 20 minutes. Thereby, a horizontal photoalignment film was formed on each of the substrates. The hot plate used was a hot plate from AS ONE Corp. (product name: EC-1200N), and the post-baking was performed under a nitrogen purge. The thickness of the post-baked horizontal photoalignment film was 70 nm. That is, the post-baked alignment film was thinner than the pre-baked alignment film.

Then, a sealant was put on the counter substrate, so that the substrates were bonded to each other. A liquid crystal material for forming a liquid crystal layer was enclosed between the substrates. Then, the bonded substrates were heated at 130° C. for 40 minutes, and the realignment treatment for the liquid crystal layer was performed (the liquid crystal molecules were aligned more in the alignment direction by photoalignment treatment). Thereby, an FFS-mode liquid crystal display panel was obtained in which the liquid crystal molecules were uniaxially aligned in the direction orthogonal to the polarization direction of the linearly polarized ultraviolet light in the photoirradiation step. Here, the liquid crystal material was enclosed between the substrates after the bonding of the substrates, but may be dropped onto one of the two substrates before the bonding. The liquid crystal material used contained liquid crystal molecules having positive anisotropy of dielectric constant. The anisotropy $\Delta\in$ of dielectric constant was 6, and the anisotropy $\Delta n$ of refractive index was 0.1. Also, the sealant may be one formed in the same manner as the step of manufacturing a typical liquid crystal display device.

The above steps were performed under yellow fluorescent lamps while exposure of the liquid crystal display panel to ultraviolet light from fluorescent lamps was prevented. Then, components such as a polarizing plate and a backlight were appropriately arranged to the liquid crystal display panel, and thereby a liquid crystal display device according to Example 1 was obtained.

Comparative Example 1

Comparative Example 1 is the case where the post-baking in Example 1 was performed only once without any manipulation during the post-baking. Since the method for manufacturing a liquid crystal display device according to Comparative Example 1 is the same as that in Example 1 except for the post-baking step, description for the points that are the same as those in Example 1 is omitted.

(Post-Baking Step)

Figure 21:
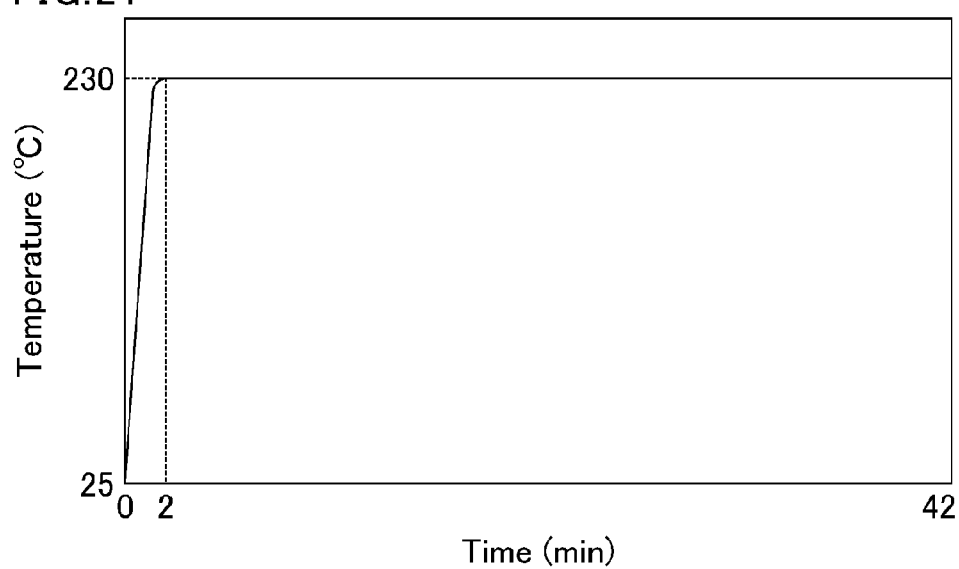
FIG. 21 is a graph showing a temperature profile for post-baking in Comparative Example 1.

The post-baking was performed on the irradiated film of the liquid crystal alignment agent on each of the two substrates with a temperature profile shown in FIG. 21. FIG. 21 is a graph showing a temperature profile for post-baking in Comparative Example 1. The substrates were placed on a 230° C. hot plate. As shown in FIG. 21, the temperature of the substrates increased from room temperature (25° C.) to 230° C. over 2 minutes, and then the post-baking was performed at 230° C. for 40 minutes. Thereby, a horizontal alignment film was formed on each of the substrates.

Evaluation Results

Example 1 and Comparative Example 1

The contrast was measured for the liquid crystal display devices manufactured by the methods for manufacturing a liquid crystal display device according to Example 1 and Comparative Example 1. For the device of Example 1, a voltage holding ratio (VHR) was also measured. A VHR is a ratio that the charged electricity is kept during one frame, and may typically be decreased when imidization by the post-baking is insufficient.

(Method for Measuring Contrast)

The liquid crystal display device included a white backlight from FUJIFILM Corporation (product name: Color Illuminator Pro A4) as a light source, two polarizing plates from SANRITZ CORPORATION (product name: HLC2-2518), and a liquid crystal display panel disposed between the two polarizing plates. Here, the easy transmission axis of the polarizing plate placed on the light-source side and the slow axis of the liquid crystal layer were arranged to be parallel to each other. The contrast was measured by (contrast)=(parallel Nicols luminance)/(crossed Nicols luminance) without application of voltage to the liquid crystal layer. The luminance (parallel Nicols luminance and crossed Nicols luminance) was measured using a spectroradiometer from TOPCON CORPORATION (product name: SR-UL2).

(Method for Measuring VHR)

The measurement of VHR was performed using an LC material characteristics measurement system from TOYO Corp. (product name: Model 6254). The voltage applied was 5 V, the holding time was 16.67 ms, and the measurement temperature was 60° C.

(Evaluation Results)

The evaluation results of each example are described below.

Example 1

The contrast was 1800 or higher, which was greatly higher than a contrast of lower than 500 in Comparative Example 1 and was at a level suitable for use as a product. This is because in Example 1, the degree of alignment of the polymers was high, and thus the crossed Nicols luminance was low. Also, the VHR was 99%, which was at a level suitable for use as a product. Therefore, the method for manufacturing a liquid crystal display device according to Example 1 can sufficiently improve the display qualities. The takt time for the post-baking step in Example 1 is the same as that for the post-baking step in Comparative Example 1, and thus the method for manufacturing a liquid crystal display device according to Example 1 can increase the degree of alignment of the polymers without changing the takt time.

Comparative Example 1

The contrast was lower than 500, which was very low. This is because in Comparative Example 1, the degree of alignment of the polymers was low, and thus the crossed Nicols luminance was high.

The contrast in Example 1 was very high compared to that in Comparative Example 1 because of the following reasons. In Example 1, the first post-baking is performed at 110° C. so that the mobility of the polymers is increased and as a result, the degree of alignment of the polymers is increased. Since significant imidization is considered to start at about 160° C. when the polymers used contain a polyamic acid, performing the second post-baking at 230° C. allows the imidization of polymers to proceed sufficiently, so that the degree of alignment is fixed at a high level. In contrast, in Comparative Example 1 where the post-baking step is not manipulated during heating, the temperature instantly increases to a temperature that allows imidization of polymers to proceed sufficiently (i.e. 230° C.). Hence, the polymers are fixed before their degree of alignment becomes sufficiently high. Therefore, the contrast in Example 1 was very high compared to that in Comparative Example 1.

Example 2-1

Example 2-1 is the case where the temperature of the first post-baking in Example 1 was 80° C. Since the method for manufacturing a liquid crystal display device according to Example 2-1 is the same as that in Example 1 except for the post-baking step, description for the points that are the same as those in Example 1 is omitted.

(Post-Baking Step)

Figure 3:
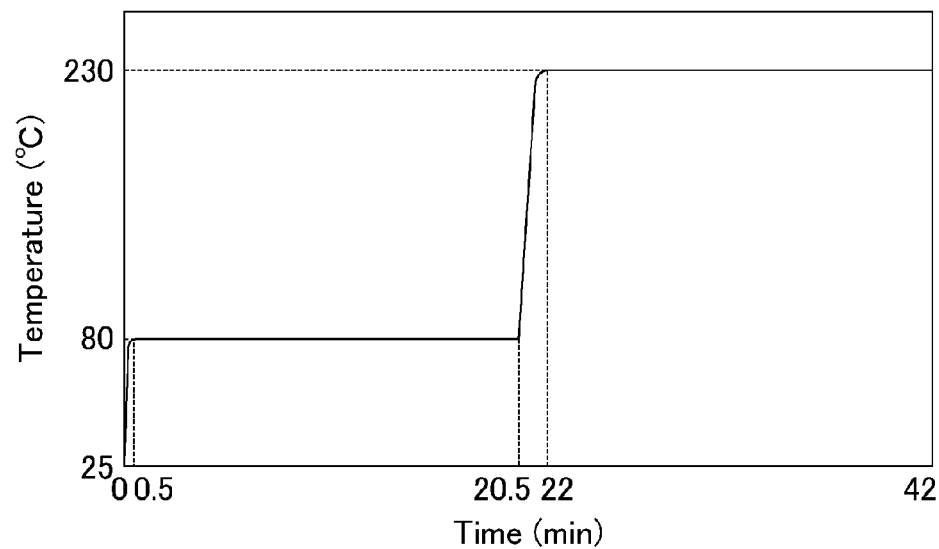
FIG. 3 is a graph showing a temperature profile for post-baking in Example 2-1.

The post-baking was performed on the irradiated film of the liquid crystal alignment agent on each of the two substrates with a temperature profile shown in FIG. 3. FIG. 3 is a graph showing a temperature profile for post-baking in Example 2-1. The substrates were placed on an 80° C. hot plate. As shown in FIG. 3, the temperature of the substrates increased from room temperature (25° C.) to 80° C. over 0.5 minutes, and then the first post-baking was performed at 80° C. for 20 minutes. Thereafter, the substrates were placed on a separately prepared 230° C. hot plate. As shown in FIG. 3, the temperature of the substrates increased from 80° C. to 230° C. over 1.5 minutes. Then, the second post-baking was performed at 230° C. for 20 minutes. Thereby, a horizontal alignment film was formed on each of the substrates.

Example 2-2

Example 2-2 is the case where the temperature of the first post-baking in Example 2-1 was 90° C. Since the method for manufacturing a liquid crystal display device according to Example 2-2 is the same as that in Example 2-1 except for the post-baking step, description for the points that are the same as those in Example 2-1 is omitted.

(Post-Baking Step)

Figure 4:
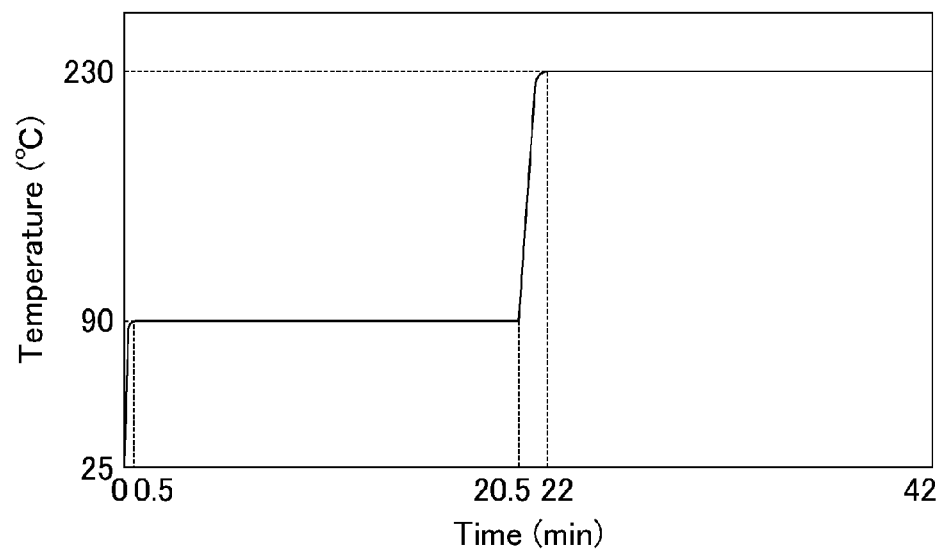
FIG. 4 is a graph showing a temperature profile for post-baking in Example 2-2.

The post-baking was performed on the irradiated film of the liquid crystal alignment agent on each of the two substrates with a temperature profile shown in FIG. 4. FIG. 4 is a graph showing a temperature profile for post-baking in Example 2-2. The substrates were placed on a 90° C. hot plate. As shown in FIG. 4, the temperature of the substrates increased from room temperature (25° C.) to 90° C. over 0.5 minutes, and then the first post-baking was performed at 90° C. for 20 minutes. Thereafter, the substrates were placed on a separately prepared 230° C. hot plate. As shown in FIG. 4, the temperature of the substrates increased from 90° C. to 230° C. over 1.5 minutes, and then the second post-baking was performed at 230° C. for 20 minutes. Thereby, a horizontal alignment film was formed on each of the substrates.

Example 2-3

Figure 5:
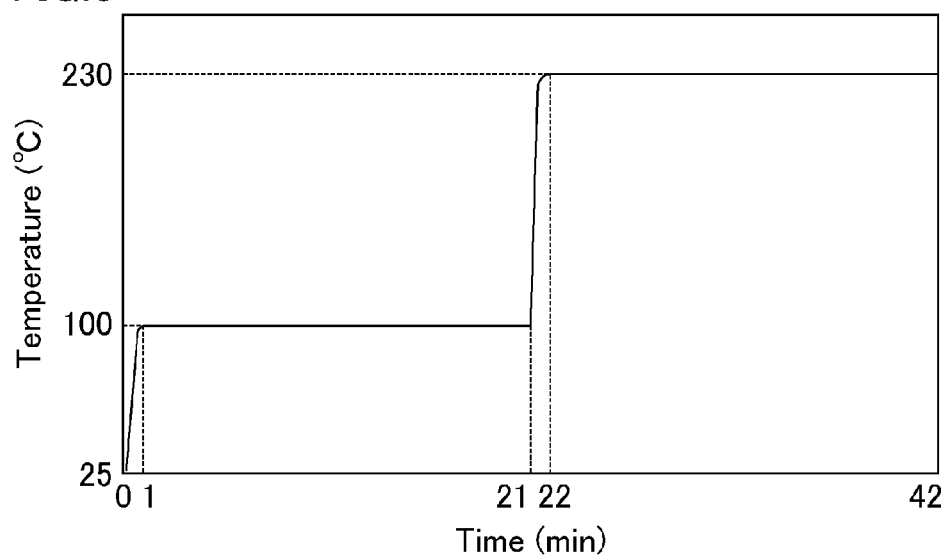
FIG. 5 is a graph showing a temperature profile for post-baking in Example 2-3.

Example 2-3 is the case where the temperature of the first post-baking in Example 2-1 was 100° C. Since the method for manufacturing a liquid crystal display device according to Example 2-3 is the same as that in Example 2-1 except for the post-baking step, description for the points that are the same as those in Example 2-1 is omitted.
(Post-Baking Step)
The post-baking was performed on the irradiated film of the liquid crystal alignment agent on each of the two substrates with a temperature profile shown in FIG. 5. FIG. 5 is a graph showing a temperature profile for post-baking in Example 2-3. The substrates were placed on a 100° C. hot plate. As shown in FIG. 5, the temperature of the substrates increased from room temperature (25° C.) to 100° C. over 1 minute, and then the first post-baking was performed at 100° C. for 20 minutes. Thereafter, the substrates were placed on a separately prepared 230° C. hot plate. As shown in FIG. 5, the temperature of the substrates increased from 100° C. to 230° C. over 1 minute, and then the second post-baking was performed at 230° C. for 20 minutes. Thereby, a horizontal alignment film was formed on each of the substrates.

Example 2-4

Example 2-4 is the case where the temperature of the first post-baking in Example 2-1 was 110° C. which is the same as that in Example 1. Since the method for manufacturing a liquid crystal display device according to Example 2-4 is the same as that in Example 1, description for the points that are the same as those in Example 1 is omitted.

Example 2-5

Figure 6:
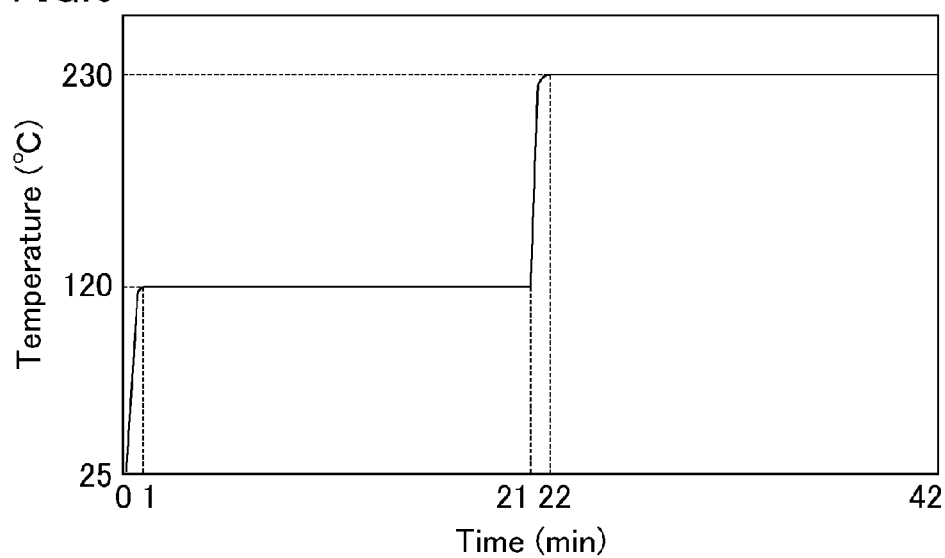
FIG. 6 is a graph showing a temperature profile for post-baking in Example 2-5.

Example 2-5 is the case where the temperature of the first post-baking in Example 2-1 was 120° C. Since the method for manufacturing a liquid crystal display device according to Example 2-5 is the same as that in Example 2-1 except for the post-baking step, description for the points that are the same as those in Example 2-1 is omitted.
(Post-Baking Step)
The post-baking was performed on the irradiated film of the liquid crystal alignment agent on each of the two substrates with a temperature profile shown in FIG. 6. FIG. 6 is a graph showing a temperature profile for post-baking in Example 2-5. The substrates were placed on a 120° C. hot plate. As shown in FIG. 6, the temperature of the substrates increased from room temperature (25° C.) to 120° C. over 1 minute, and then the first post-baking was performed at 120° C. for 20 minutes. Thereafter, the substrates were placed on a separately prepared 230° C. hot plate. As shown in FIG. 6, the temperature of the substrates increased from 120° C. to 230° C. over 1 minute, and then the second post-baking was performed at 230° C. for 20 minutes. Thereby, a horizontal alignment film was formed on each of the substrates.

Example 2-6

Figure 7:
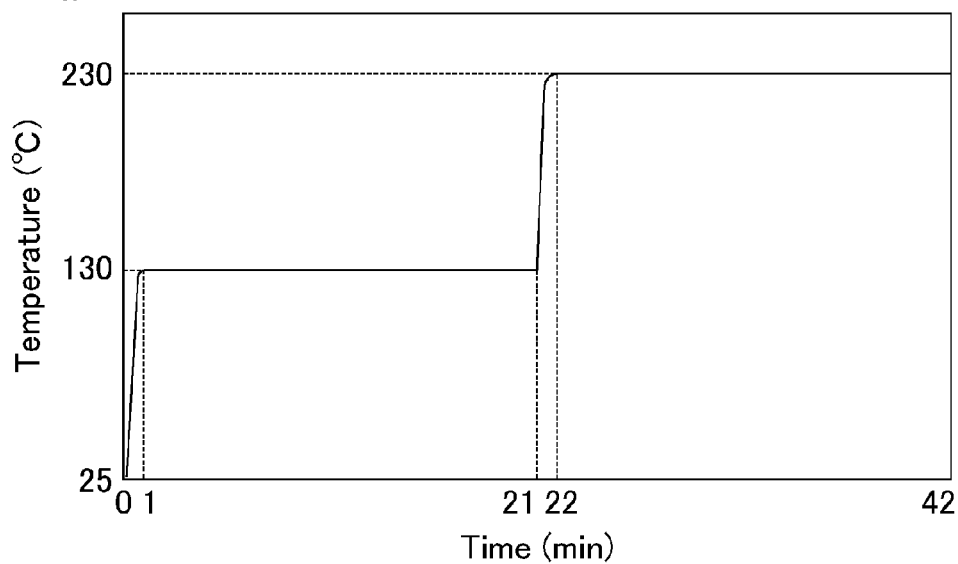
FIG. 7 is a graph showing a temperature profile for post-baking in Example 2-6.

Example 26 is the case where the temperature of the first post-baking in Example 2-1 was 130° C. Since the method for manufacturing a liquid crystal display device according to Example 2-6 is the same as that in Example 2-1 except for the post-baking step, description for the points that are same as those in Example 2-1 is omitted.
(Post-Baking Step)
The post-baking was performed on the irradiated film of the liquid crystal alignment agent on each of the two substrates with a temperature profile shown in FIG. 7. FIG. 7 is a graph showing a temperature profile for post-baking in Example 2-6. The substrates were placed on a 130° C. hot plate. As shown in FIG. 7, the temperature of the substrates increased from room temperature (25° C.) to 130° C. over 1 minute, and then the first post-baking was performed at 130° C. for 20 minutes. Thereafter, the substrates were placed on a separately prepared 230° C. hot plate. As shown in FIG. 7, the temperature of the substrates increased from 130° C. to 230° C. over 1 minute, and then the second post-baking was performed at 230° C. for 20 minutes. Thereby, a horizontal alignment film was formed on each of the substrates.

Example 2-7

Figure 8:
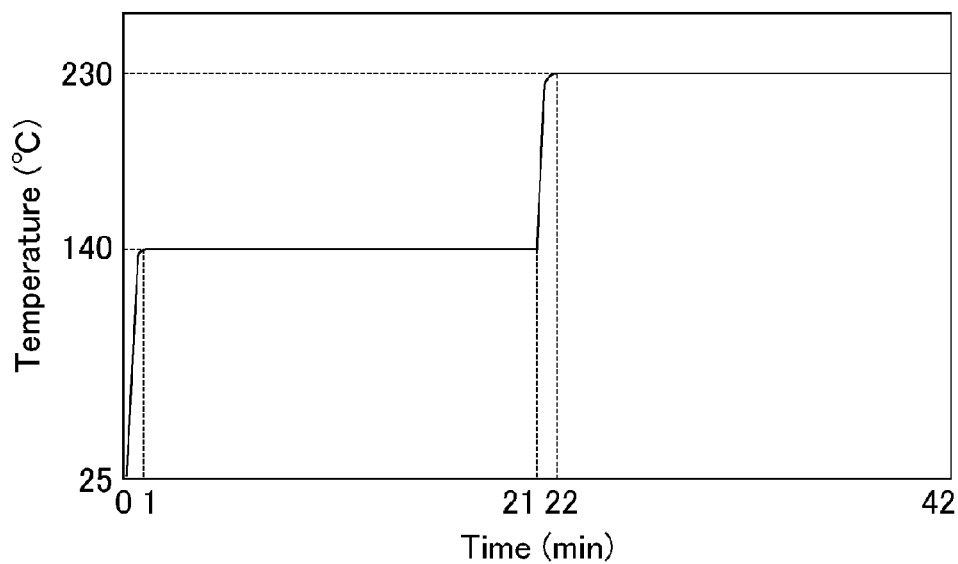
FIG. 8 is a graph showing a temperature profile for post-baking in Example 2-7.

Example 2-7 is the case where the temperature of the first post-baking in Example 2-1 was 140° C. Since the method for manufacturing a liquid crystal display device according to Example 2-7 is the same as that in Example 2-1 except for the post-baking step, description for the points that are the same as those in Example 2-1 is omitted.
(Post-Baking Step)
The post-baking was performed on the irradiated film of the liquid crystal alignment agent on each of the two substrates with a temperature profile shown in FIG. 8. FIG. 8 is a graph showing a temperature profile for post-baking in Example 2-7. The substrates were placed on a 140° C. hot plate. As shown in FIG. 8, the temperature of the substrates increased from room temperature (25° C.) to 140° C. over 1 minute, and then the first post-baking was performed at 140° C. for 20 minutes. Thereafter, the substrates were placed on a separately prepared 230° C. hot plate. As shown in FIG. 8, the temperature of the substrates increased from 140° C. to 230° C. over 1 minute, and then the second post-baking was performed at 230° C. for 20 minutes. Thereby, a horizontal alignment film was formed on each of the substrates.

Evaluation Results

Examples 2-1 to 2-7

The temperature for post-baking and the evaluation results of the contrast and the VHR of each liquid crystal display device manufactured by the method for manufacturing a liquid crystal display device according to one of Examples 2-1 to 2-7 are summarized in Table 1. Here, the contrast and the VHR were measured by the same methods as those in Example 1.
(Method for Evaluating Contrast and VHR)
The contrasts were graded into four levels, namely level 1: a contrast of 1800 or higher, level 2: a contrast from 1200 inclusive to 1800 exclusive, level 3: a contrast from 500 inclusive to 1200 exclusive, and level 4: a contrast of lower than 500. Here, devices of the evaluation result level 1, 2, or 3 were considered to be at a level suitable for use as a product, while devices of the evaluation result level 4 were not considered to be suitable for use as a product. As for VHR, devices with a value of 98% or higher were considered to be suitable for use as a product.

TABLE 1

|  | Temperature for post-baking (° C.) | | Evaluation result | |
| --- | --- | --- | --- | --- |
|  | 1st | 2nd | Contrast | VHR (%) |
| Example 2-1 | 80 | 230 | Level 2 | 99 |
| Example 2-2 | 90 | 230 | Level 2 | 99 |
| Example 2-3 | 100 | 230 | Level 1 | 99 |
| Example 2-4 | 110 | 230 | Level 1 | 99 |
| Example 2-5 | 120 | 230 | Level 1 | 99 |
| Example 2-6 | 130 | 230 | Level 2 | 99 |
| Example 2-7 | 140 | 230 | Level 2 | 99 |

(Evaluation Results)

The evaluation results of each example are described below.

Example 2-1

The evaluation result of the contrast was level 2 which was at a level suitable for use as a product. This is because in Example 2-1, the degree of alignment of the polymers was high, and thus the crossed Nicols luminance was low. Also, the VHR was 99%, which was at a level suitable for use as a product. Therefore, the method for manufacturing a liquid crystal display device according to Example 2-1 can sufficiently improve the display qualities. The takt time for the post-baking step in Example 2-1 is the same as that for the post-baking step in Comparative Example 1, and thus the method for manufacturing a liquid crystal display device according to Example 2-1 can increase the degree of alignment of the polymers without changing the takt time.

Example 2-2

The evaluation result of the contrast was level 2 which was at a level suitable for use as a product. This is because in Example 2-2, the degree of alignment of the polymers was high, and thus the crossed Nicols luminance was low. Also, the VHR was 99%, which was at a level suitable for use as a product. Therefore, the method for manufacturing a liquid crystal display device according to Example 2-2 can sufficiently improve the display qualities. The takt time for the post-baking step in Example 2-2 is the same as that for the post-baking step in Comparative Example 1, and thus the method for manufacturing a liquid crystal display device according to Example 2-2 can increase the degree of alignment of the polymers without changing the takt time.

Example 2-3

The evaluation result of the contrast was level 1 which was at a level suitable for use as a product. This is because in Example 2-3, the degree of alignment of the polymers was high, and thus the crossed Nicols luminance was low. Also, the VHR was 99%, which was at a level suitable for use as a product. Therefore, the method for manufacturing a liquid crystal display device according to Example 2-3 can sufficiently improve the display qualities. The takt time for the post-baking step in Example 2-3 is the same as that for the post-baking step in Comparative Example 1, and thus the method for manufacturing a liquid crystal display device according to Example 2-3 can increase the degree of alignment of the polymers without changing the takt time.

Examples 2-4

The evaluation result of the contrast was level 1 which was at a level suitable for use as a product. This is because in Example 2-4, the degree of alignment of the polymers was high, and thus the crossed Nicols luminance was low. Also, the VHR was 99%, which was at a level suitable for use as a product. Therefore, the method for manufacturing a liquid crystal display device according to Example 2-4 can sufficiently improve the display qualities. The takt time for the post-baking step in Example 2-4 is the same as that for the post-baking step in Comparative Example 1, and thus the method for manufacturing a liquid crystal display device according to Example 2-4 can increase the degree of alignment of the polymers without changing the takt time.

Example 2-5

The evaluation result of the contrast was level 1 which was at a level suitable for use as a product. This is because in Example 2-5, the degree of alignment of the polymers was high, and thus the crossed Nicols luminance was low. Also, the VHR was 99%, which was at a level suitable for use as a product. Therefore, the method for manufacturing a liquid crystal display device according to Example 2-5 can sufficiently improve the display qualities. The takt time for the post-baking step in Example 2-5 is the same as that for the post-baking step in Comparative Example 1, and thus the method for manufacturing a liquid crystal display device according to Example 2-5 can increase the degree of alignment of the polymers without changing the takt time.

Examples 2-6

The evaluation result of the contrast was level 2 which was at a level suitable for use as a product. This is because in Example 2-6, the degree of alignment of the polymers was high, and thus the crossed Nicols luminance was low. Also, the VHR was 99%, which was at a level suitable for use as a product. Therefore, the method for manufacturing a liquid crystal display device according to Example 2-6 can sufficiently improve the display qualities. The takt time for the post-baking step in Example 2-6 is the same as that for the post-baking step in Comparative Example 1, and thus the method for manufacturing a liquid crystal display device according to Example 2-6 can increase the degree of alignment of the polymers without changing the takt time.

Example 2-7

The evaluation result of the contrast was level 2 which was at a level suitable for use as a product. This is because in Example 2-7, the degree of alignment of the polymers was high, and thus the crossed Nicols luminance was low. Also, the VHR was 99%, which was at a level suitable for use as a product. Therefore, the method for manufacturing a liquid crystal display device according to Example 2-7 can sufficiently improve the display qualities. The takt time for the post-baking step in Example 2-7 is the same as that for the post-baking step in Comparative Example 1, and thus the method for manufacturing a liquid crystal display device according to Example 2-7 can increase the degree of alignment of the polymers without changing the takt time.

The contrasts in Examples 2-3 to 2-5 were high compared to the contrasts in the other examples because of the following reasons. To increase the degree of alignment of polymers, it is important to increase the mobility of polymers at temperatures that does not cause sufficient imidization of polymers and then to fix the degree of alignment at a high level by allowing the polymers to be sufficiently imidized. Too high a temperature for the first post-baking may cause the imidization to proceed gradually, which increases the rigidity of the polymers. Hence, the contrast may decrease. Too low a temperature for the first post-baking decreases the mobility of the polymers, which may decrease the contrast. Accordingly, in Examples 2-3 to 2-5, selecting the temperature for the first post-baking (100° C. to 120° C.) further increases the mobility of the polymers, and thus further increases the degree of alignment of polymers. Then, the second post-baking fixes the degree of alignment at a high level, and volatilizes the residual solvent, leading to favorable electric characteristics (VHR).

As described above, the preferred temperature for the first post-baking was found to be from 100° C. inclusive to 120° C. inclusive. When the temperature for the first post-baking is lower than 100° C., the mobility of the polymers may not sufficiently increase. When the temperature for the first post-baking is higher than 120° C., the imidization of the polymers may gradually proceed, inhibiting the degree of alignment of the polymers from sufficiently increasing. Here, the first post-baking is designed to be performed for 20 minutes, but it is clear that the same effect can be achieved even if the post-baking is performed for longer than 20 minutes from the viewpoint of increasing the mobility of the polymers.

Example 3-1

Figure 9:
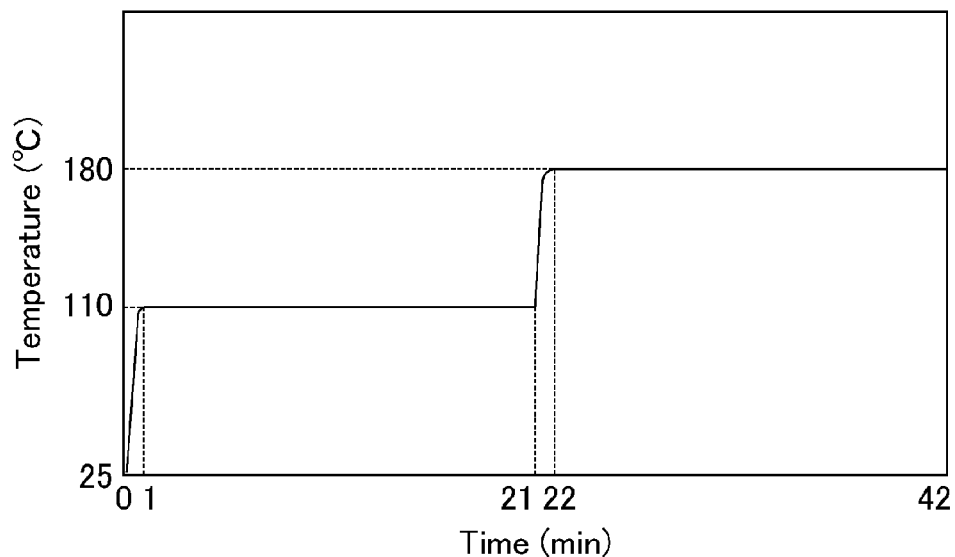
FIG. 9 is a graph showing a temperature profile for post-baking in Example 3-1.

Example 3-1 is the case where the temperature of the second post-baking in Example 1 was 180° C. Since the method for manufacturing a liquid crystal display device according to Example 3-1 is the same as that in Example 1 except for the post-baking step, description for the points that are the same as those in Example 1 is omitted.
(Post-Baking Step)
The post-baking was performed on the irradiated film of the liquid crystal alignment agent on each of the two substrates with a temperature profile shown in FIG. 9. FIG. 9 is a graph showing a temperature profile for post-baking in Example 3-1. The substrates were placed on a 110° C. hot plate. As shown in FIG. 9, the temperature of the substrates increased from room temperature (25° C.) to 110° C. over 1 minute, and then the first post-baking was performed at 110° C. for 20 minutes. Thereafter, the substrates were placed on a separately prepared 180° C. hot plate. As shown in FIG. 9, the temperature of the substrates increased from 110° C. to 180° C. over 1 minute, and then the second post-baking was performed at 180° C. for 20 minutes. Thereby, a horizontal alignment film was formed on each of the substrates.

Example 3-2

Figure 10:
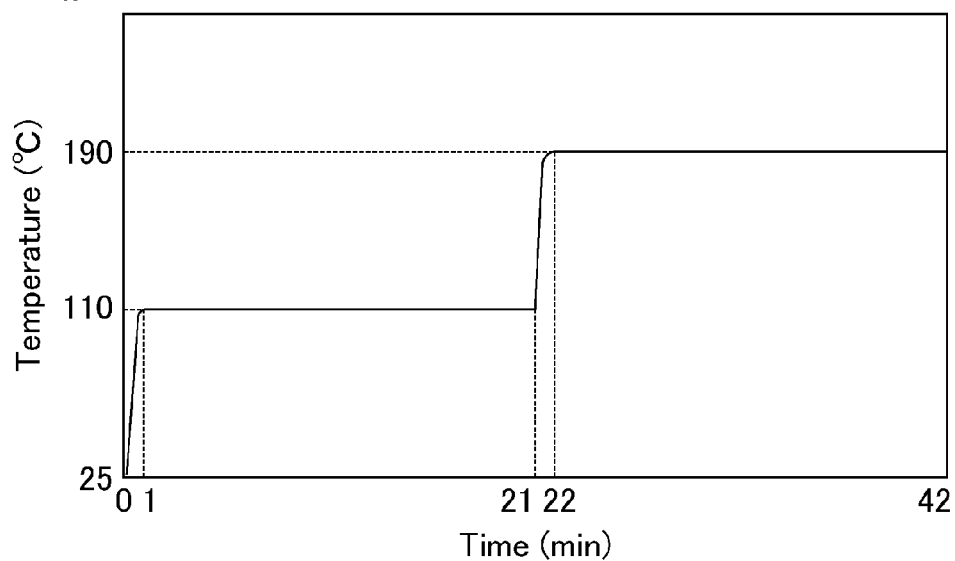
FIG. 10 is a graph showing a temperature profile for post-baking in Example 3-2.

Example 3-2 is the case where the temperature of the second post-baking in Example 3-1 was 190° C. Since the method for manufacturing a liquid crystal display device according to Example 3-2 is the same as that in Example 3-1 except for the post-baking step, description for the points that are the same as those in Example 3-1 is omitted.
(Post-Baking Step)
The post-baking was performed on the irradiated film of the liquid crystal alignment agent on each of the two substrates with a temperature profile shown in FIG. 10. FIG. 10 is a graph showing a temperature profile for post-baking in Example 3-2. The substrates were placed on a 110° C. hot plate. As shown in FIG. 10, the temperature of the substrates increased from room temperature (25° C.) to 110° C. over 1 minute, and then the first post-baking was performed at 110° C. for 20 minutes. Thereafter, the substrates were placed on a separately prepared 190° C. hot plate. As shown in FIG. 10, the temperature of the substrates increased from 110° C. to 190° C. over 1 minute, and then the second post-baking was performed at 190° C. for 20 minutes. Thereby, a horizontal alignment film was formed on each of the substrates.

Example 3-3

Figure 11:
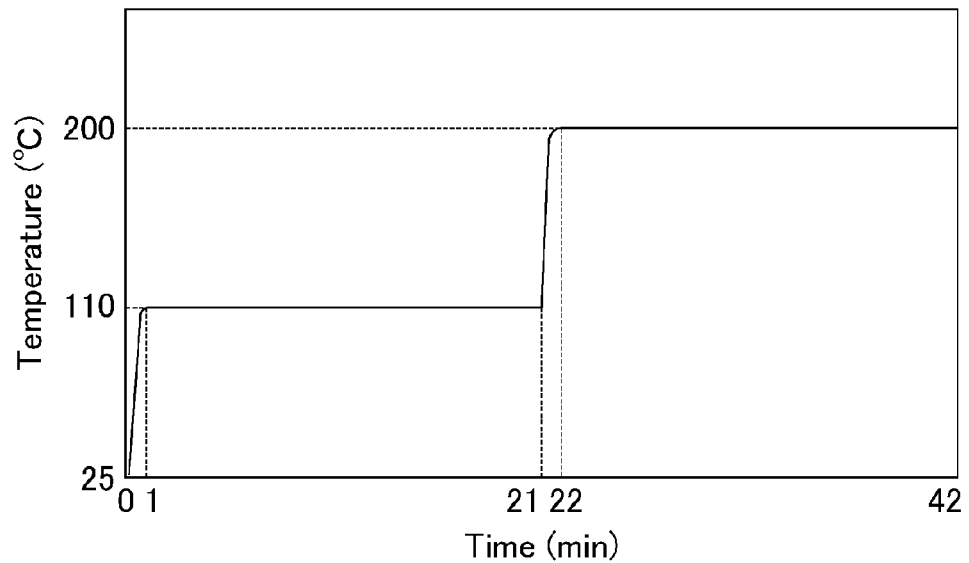
FIG. 11 is a graph showing a temperature profile for post-baking in Example 3-3.

Example 3-3 is the case where the temperature of the second post-baking in Example 3-1 was 200° C. Since the method for manufacturing a liquid crystal display device according to Example 3-3 is the same as that in Example 3-1 except for the post-baking step, description for the points that are the same as those in Example 3-1 is omitted.
(Post-Baking Step)
The post-baking was performed on the irradiated film of the liquid crystal alignment agent on each of the two substrates with a temperature profile shown in FIG. 11. FIG. 11 is a graph showing a temperature profile for post-baking in Example 3-3. The substrates were placed on a 110° C. hot plate. As shown in FIG. 11, the temperature of the substrates increased from room temperature (25° C.) to 110° C. over 1 minute, and then the first post-baking was performed at 110° C. for 20 minutes. Thereafter, the substrates were placed on a separately prepared 200° C. hot plate. As shown in FIG. 11, the temperature of the substrates increased from 110° C. to 200° C. over 1 minute, and then the second post-baking was performed at 200° C. for 20 minutes. Thereby, a horizontal alignment film was formed on each of the substrates.

Example 3-4

Figure 12:
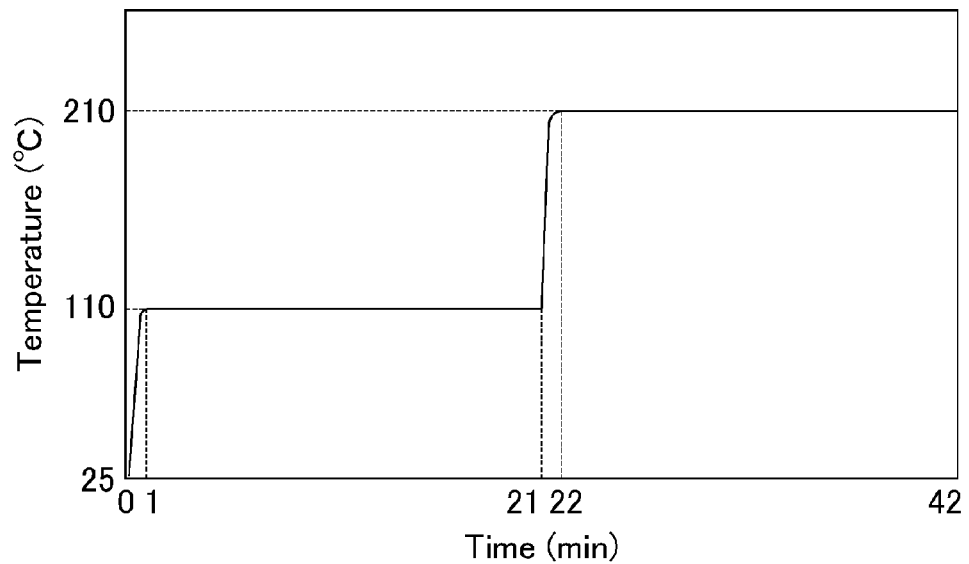
FIG. 12 is a graph showing a temperature profile for post-baking in Example 3-4.

Example 3-4 is the case where the temperature of the second post-baking in Example 3-1 was 210° C. Since the method for manufacturing a liquid crystal display device according to Example 3-4 is the same as that in Example 3-1 except for the post-baking step, description for the points that are the same as those in Example 3-1 is omitted.
(Post-Baking Step)
The post-baking was performed on the irradiated film of the liquid crystal alignment agent on each of the two substrates with a temperature profile shown in FIG. 12. FIG. 12 is a graph showing a temperature profile for post-baking in Example 3-4. The substrates were placed on a 110° C. hot plate. As shown in FIG. 12, the temperature of the substrates increased from room temperature (25° C.) to 110° C. over 1 minute, and then the first post-baking was performed at 110° C. for 20 minutes. Thereafter, the substrates were placed on a separately prepared 210° C. hot plate. As shown in FIG. 12, the temperature of the substrates increased from 110° C. to 210° C. over 1 minute, and then the second post-baking was performed at 210° C. for 20 minutes. Thereby, a horizontal alignment film was formed on each of the substrates.

Example 3-5

Figure 13:
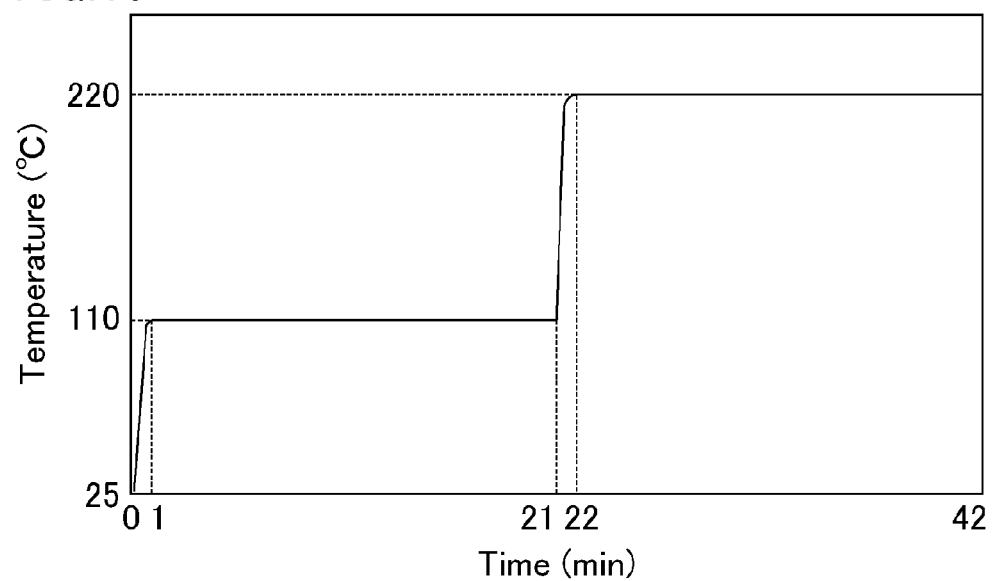
FIG. 13 is a graph showing a temperature profile for post-baking in Example 3-5.

Example 3-5 is the case where the temperature of the second post-baking in Example 3-1 was 220° C. Since the method for manufacturing a liquid crystal display device according to Example 3-5 is the same as that in Example 3-1 except for the post-baking step, description for the points that are the same as those in Example 3-1 is omitted.
(Post-Baking Step)
The post-baking was performed on the irradiated film of the liquid crystal alignment agent on each of the two substrates with a temperature profile shown in FIG. 13. FIG. 13 is a graph showing a temperature profile for post-baking in Example 3-5. The substrates were placed on a 110° C. hot plate. As shown in FIG. 13, the temperature of the substrates increased from room temperature (25° C.) to 110° C. over 1 minute, and then the first post-baking was performed at 110° C. for 20 minutes. Thereafter, the substrates were placed on a separately prepared 220° C. hot plate. As shown in FIG. 13, the temperature of the substrates increased from 110° C. to 220° C. over 1 minute, and then the second post-baking was performed at 220° C. for 20 minutes. Thereby, a horizontal alignment film was formed on each of the substrates.

Example 3-6

Example 3-6 is the case where the temperature of the second post-baking in Example 3-1 was 230° C. which is the same as that in Example 1. Since the method for manufacturing a liquid crystal display device according to Example 3-6 is the same as that in Example 1, description for the points that are the same as those in Example 1 is omitted.

Evaluation Results

Examples 3-1 to 3-6

The temperature for post-baking and the evaluation results of the contrast and the VHR of each liquid crystal display device manufactured by the method for manufacturing a liquid crystal display device according to one of Examples 3-1 to 3-6 are summarized in Table 2. Here, the contrast and the VHR were measured and evaluated by the same methods as those in Examples 2-1 to 2-7.

TABLE 2

| | Temperature for post-baking (° C.) | | Evaluation result | |
|---|---|---|---|---|
| | 1st | 2nd | Contrast | VHR (%) |
| Example 3-1 | 110 | 180 | Level 2 | 98 |
| Example 3-2 | 110 | 190 | Level 1 | 98 |
| Example 3-3 | 110 | 200 | Level 1 | 99 |
| Example 3-4 | 110 | 210 | Level 1 | 99 |
| Example 3-5 | 110 | 220 | Level 1 | 99 |
| Example 3-6 | 110 | 230 | Level 1 | 99 |

Example 3-1

The evaluation result of the contrast was level 2 which was at a level suitable for use as a product. This is because in Example 3-1, the degree of alignment of the polymers was high, and thus the crossed Nicols luminance was low. Also, the VHR was 98%, which was at a level suitable for use as a product. Therefore, the method for manufacturing a liquid crystal display device according to Example 3-1 can sufficiently improve the display qualities. The takt time for the post-baking step in Example 3-1 is the same as that for the post-baking step in Comparative Example 1, and thus the method for manufacturing a liquid crystal display device according to Example 3-1 can increase the degree of alignment of the polymers without changing the takt time.

Example 3-2

The evaluation result of the contrast was level 1 which was at a level suitable for use as a product. This is because in Example 3-2, the degree of alignment of the polymers was high, and thus the crossed Nicols luminance was low. Also, the VHR was 98%, which was at a level suitable for use as a product. Therefore, the method for manufacturing a liquid crystal display device according to Example 3-2 can sufficiently improve the display qualities. The takt time for the post-baking step in Example 3-2 is the same as that for the post-baking step in Comparative Example 1, and thus the method for manufacturing a liquid crystal display device according to Example 3-2 can increase the degree of alignment of the polymers without changing the takt time.

Example 3-3

The evaluation result of the contrast was level 1 which was at a level suitable for use as a product. This is because in Example 3-3, the degree of alignment of the polymers was high, and thus the crossed Nicols luminance was low. Also, the VHR was 99%, which was at a level suitable for use as a product. Therefore, the method for manufacturing a liquid crystal display device according to Example 3-3 can sufficiently improve the display qualities. The takt time for the post-baking step in Example 3-3 is the same as that for the post-baking step in Comparative Example 1, and thus the method for manufacturing a liquid crystal display device according to Example 3-3 can increase the degree of alignment of the polymers without changing the takt time.

Example 3-4

The evaluation result of the contrast was level 1 which was at a level suitable for use as a product. This is because in Example 3-4, the degree of alignment of the polymers was high, and thus the crossed Nicols luminance was low. Also, the VHR was 99%, which was at a level suitable for use as a product. Therefore, the method for manufacturing a liquid crystal display device according to Example 3-4 can sufficiently improve the display qualities. The takt time for the post-baking step in Example 3-4 is the same as that for the post-baking step in Comparative Example 1, and thus the method for manufacturing a liquid crystal display device according to Example 3-4 can increase the degree of alignment of the polymers without changing the takt time.

Examples 3-5

The evaluation result of the contrast was level 1 which was at a level suitable for use as a product. This is because in Example 3-5, the degree of alignment of the polymers was high, and thus the crossed Nicols luminance was low. Also, the VHR was 99%, which was at a level suitable for use as a product. Therefore, the method for manufacturing a liquid crystal display device according to Example 3-5 can sufficiently improve the display qualities. The takt time for the post-baking step in Example 3-5 is the same as that for the post-baking step in Comparative Example 1, and thus the method for manufacturing a liquid crystal display device according to Example 3-5 can increase the degree of alignment of the polymers without changing the takt time.

Example 3-6

The evaluation result of the contrast was level 1 which was at a level suitable for use as a product. This is because in Example 3-6, the degree of alignment of the polymers was high, and thus the crossed Nicols luminance was low. Also, the VHR was 99%, which was at a level suitable for use as a product. Therefore, the method for manufacturing a liquid crystal display device according to Example 3-6 can sufficiently improve the display qualities. The takt time for the post-baking step in Example 3-6 is the same as that for the post-baking step in Comparative Example 1, and thus the method for manufacturing a liquid crystal display device according to Example 3-6 can increase the degree of alignment of the polymers without changing the takt time.

The display qualities (contrast and VHR) in Examples 3-3 to 3-6 were favorable compared to those in Examples 3-1 and 3-2 because of the following reasons. A higher temperature for the second post-baking allows the polymers to be imidized more sufficiently, and also decreases the residual solvent by volatilization, thereby further increasing the VHR. Since a higher temperature for the second post-baking allows the polymers to be imidized more sufficiently, the degree of alignment can be fixed at a high level that is obtained by the first post-baking. As a result, the contrast is further increased. Therefore, selecting the temperature for the second post-baking in Examples 3-3 to 3-6 (200° C. or higher) can provide better display qualities.

As described above, the temperature for the second post-baking was found to be preferably 200° C. or higher. When the temperature for the second post-baking is lower than 200° C., imidization of polymers and volatilization of the residual solvent may not sufficiently proceed. More preferably, the temperature for the second post-baking is from 200° C. inclusive to 250° C. inclusive. If one of the two substrates includes a color filter layer and the temperature for the second post-baking is higher 250° C., the color of the color filter layer may be faded, which possibly decreases the display qualities.

Example 4-1

Example 4-1 is the case where the temperature of pre-baking in Example 1 was 40° C. Since the method for manufacturing a liquid crystal display device according to Example 4-1 is the same as that in Example 1 except for the pre-baking step, description for the points that are the same as those in Example 1 is omitted.
(Pre-Baking Step)

Figure 14:
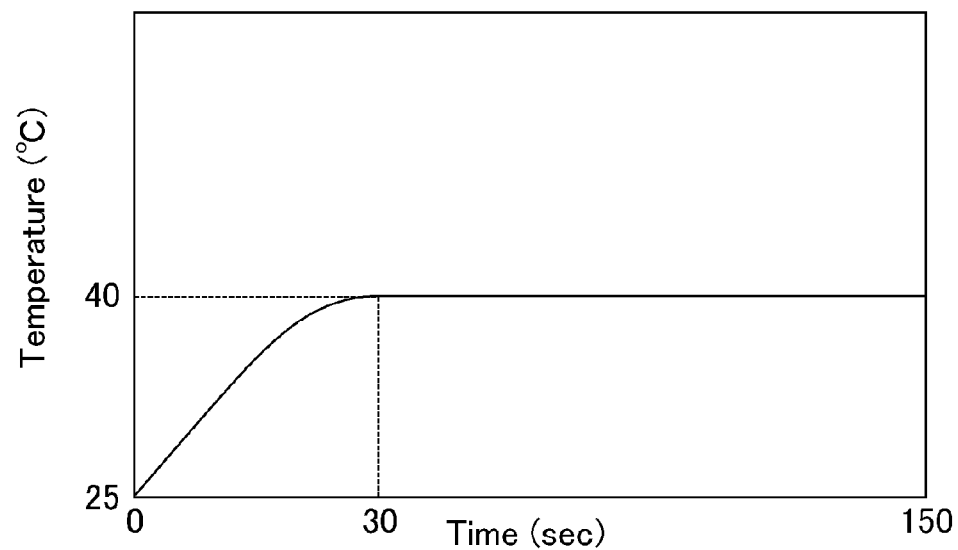
FIG. 14 is a graph showing a temperature profile for pre-baking in Example 4-1.

The pre-baking was performed on the film of the liquid crystal alignment agent on each of the two substrates with a temperature profile shown in FIG. 14. FIG. 14 is a graph showing a temperature profile for pre-baking in Example 4-1. The substrates were placed on a 40° C. hot plate. As shown in FIG. 14, the temperature of the substrates increased from room temperature (25° C.) to 40° C. over 30 seconds, and then the pre-baking was performed at 40° C. for 120 seconds.

Examples 4-2

Example 4-2 is the case where the temperature of the pre-baking in Example 4-1 was 50° C. Since the method for manufacturing a liquid crystal display device according to Example 4-2 is the same as that in Example 4-1 except for the pre-baking step, description for the points that are the same as those in Example 4-1 is omitted.
(Pre-Baking Step)

Figure 15:
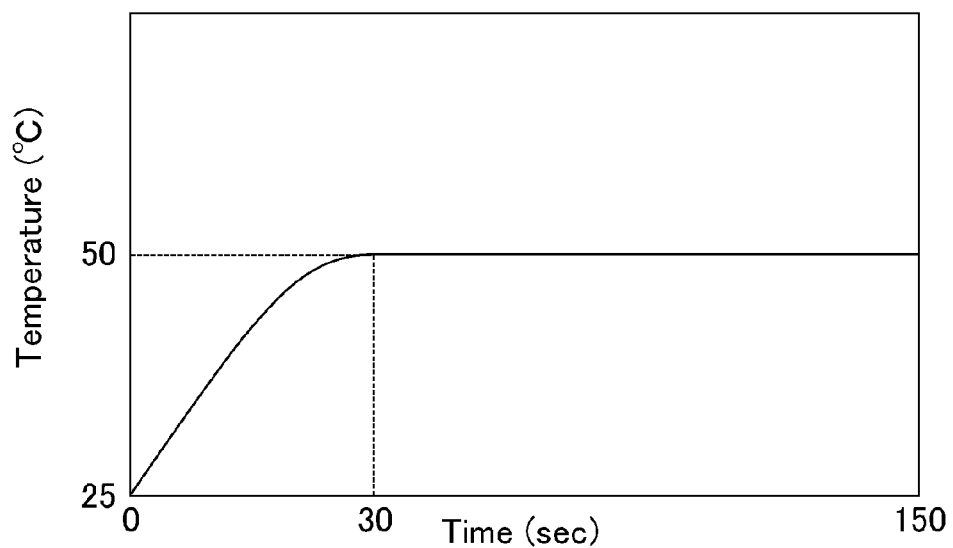
FIG. 15 is a graph showing a temperature profile for pre-baking in Example 4-2.

The pre-baking was performed on the film of the liquid crystal alignment agent on each of the two substrates with a temperature profile shown in FIG. 15. FIG. 15 is a graph showing a temperature profile for pre-baking in Example 4-2. The substrates were placed on a 50° C. hot plate. As shown in FIG. 15, the temperature of the substrates increased from room temperature (25° C.) to 50° C. over 30 seconds, and then the pre-baking was performed at 50° C. for 120 seconds.

Example 4-3

Example 4-3 is the case where the temperature of the pre-baking in Example 4-1 was 60° C. which is the same as that in Example 1. Since the method for manufacturing a liquid crystal display device according to Example 4-3 is the same as that in Example 1, description for the points that are the same as those in Example 1 is omitted.

Example 4-4

Example 4-4 is the case where the temperature of the pre-baking in Example 4-1 was 70° C. Since the method for manufacturing a liquid crystal display device according to Example 4-4 is the same as that in Example 4-1 except for the pre-baking step, description for the points that are the same as those in Example 4-1 is omitted.
(Pre-Baking Step)

Figure 16:
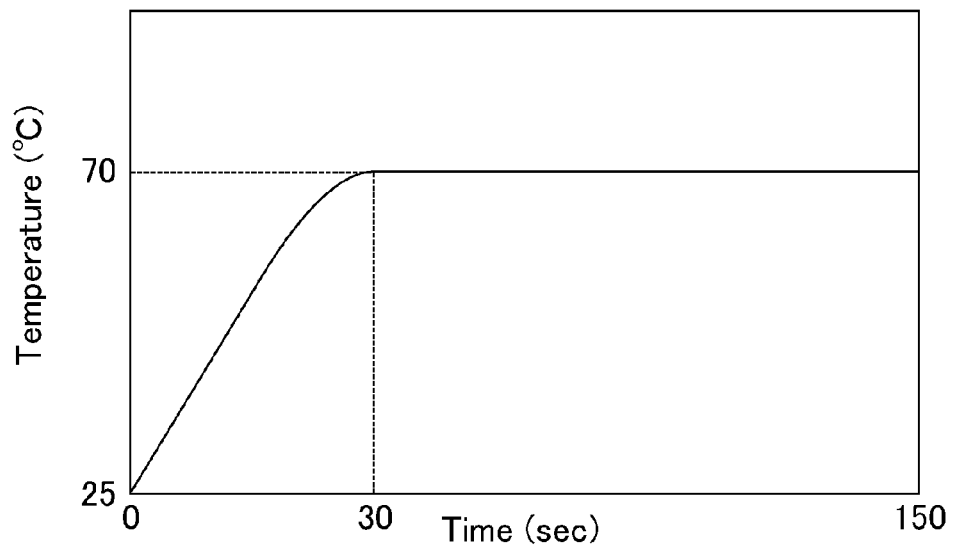
FIG. 16 is a graph showing a temperature profile for pre-baking in Example 4-4.

The pre-baking was performed on the film of the liquid crystal alignment agent on each of the two substrates with a temperature profile shown in FIG. 16. FIG. 16 is a graph showing a temperature profile for pre-baking in Example 4-4. The substrates were placed on a 70° C. hot plate. As shown in FIG. 16, the temperature of the substrates increased from room temperature (25° C.) to 70° C. over 30 seconds, and then the pre-baking was performed at 70° C. for 120 seconds.

Example 4-5

Example 45 is the case where the temperature of the pre-baking in Example 4-1 was 80° C. Since the method for manufacturing a liquid crystal display device according to Example 4-5 is the same as that in Example 4-1 except for the pre-baking step, description for the points that are the same as those in Example 4-1 is omitted.
(Pre-Baking Step)

Figure 17:
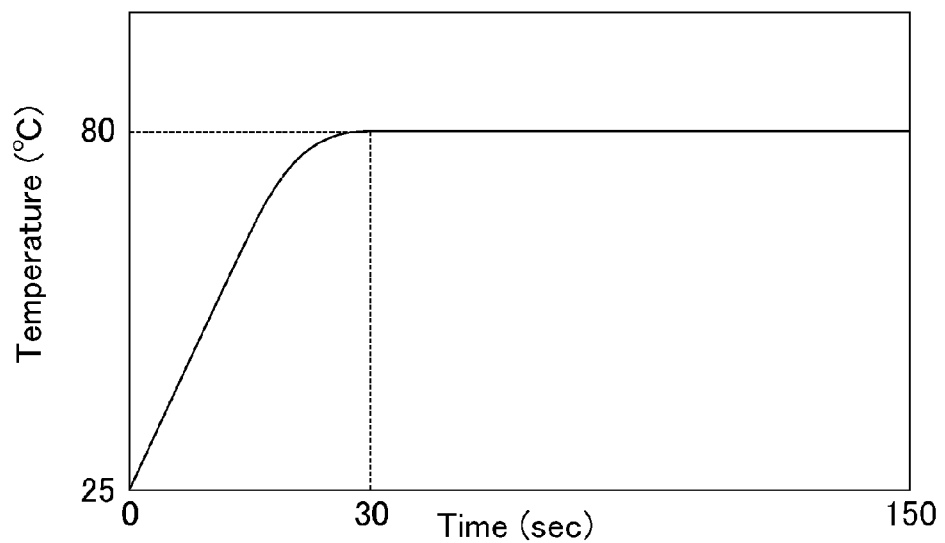
FIG. 17 is a graph showing a temperature profile for pre-baking in Example 4-5.

The pre-baking was performed on the film of the liquid crystal alignment agent on each of the two substrates with a temperature profile shown in FIG. 17. FIG. 17 is a graph showing a temperature profile for pre-baking in Example 4-5. The substrates were placed on an 80° C. hot plate. As illustrated in FIG. 17, the temperature of the substrates increased from room temperature (25° C.) to 80° C. over 30 seconds, and then the pre-baking was performed at 80° C. for 120 seconds.

Example 4-6

Example 4-6 is the case where the temperature of the pre-baking in Example 4-1 was 90° C. Since the method for manufacturing a liquid crystal display device according to Example 46 is the same as that in Example 4-1 except for the pre-baking step, description for the points that are the same as those in Example 4-1 is omitted.
(Pre-Baking Step)

Figure 18:
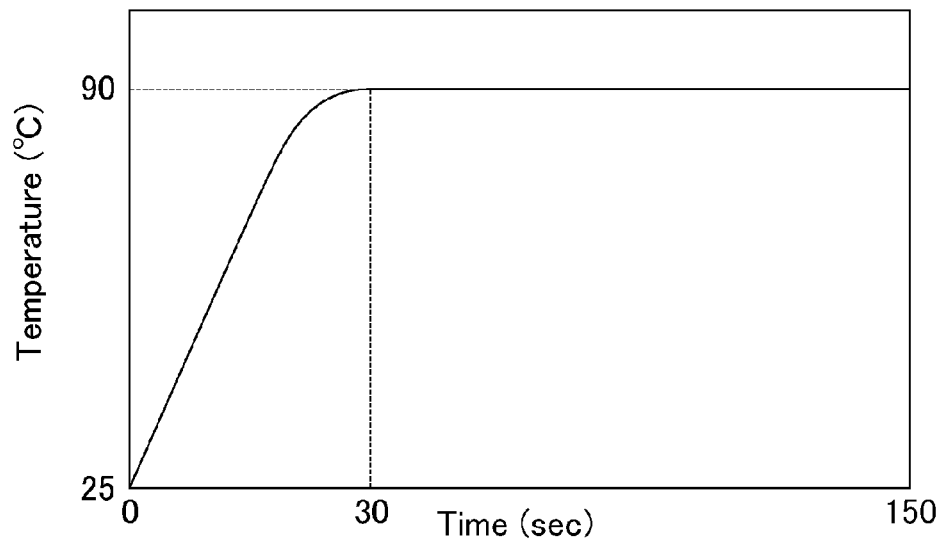
FIG. 18 is a graph showing a temperature profile for pre-baking in Example 4-6.

The pre-baking was performed on the film of the liquid crystal alignment agent on each of the two substrates with a temperature profile shown in FIG. 18. FIG. 18 is a graph showing a temperature profile for pre-baking in Example 4-6. The substrates were placed on a 90° C. hot plate. As shown in FIG. 18, the temperature of the substrates increased from room temperature (25° C.) to 90° C. over 30 seconds, and then the pre-baking was performed at 90° C. for 120 seconds.

Evaluation Results

Examples 4-1 to 4-6

The temperature for the pre-baking and the evaluation results of the contrast and the VHR of each liquid crystal display device manufactured by the method for manufacturing a liquid crystal display device according to one of Examples 4-1 to 4-6 are summarized in Table 3. Here, the contrast and the VHR were measured by the same methods as those in Examples 2-1 to 2-7.

TABLE 3

| | Temperature for pre-baking (° C.) | Evaluation result | |
|---|---|---|---|
| | | Contrast | VHR (%) |
| Example 4-1 | 40 | Level 1 | 99 |
| Example 4-2 | 50 | Level 1 | 99 |
| Example 4-3 | 60 | Level 1 | 99 |
| Example 4-4 | 70 | Level 1 | 99 |
| Example 4-5 | 80 | Level 2 | 99 |
| Example 4-6 | 90 | Level 2 | 99 |

Example 4-1

The evaluation result of the contrast was level 1 which was at a level suitable for use as a product. This is because in Example 4-1, the degree of alignment of the polymers was high, and thus the crossed Nicols luminance was low. Also, the VHR was 99%, which was at a level suitable for use as a product. Therefore, the method for manufacturing a liquid crystal display device according to Example 4-1 can sufficiently improve the display qualities.

Example 4-2

The evaluation result of the contrast was level 1 which was at a level suitable for use as a product. This is because in Example 4-2, the degree of alignment of the polymers was high, and thus the crossed Nicols luminance was low. Also, the VHR was 99%, which was at a level suitable for use as a product. Therefore, the method for manufacturing a liquid crystal display device according to Example 42 can sufficiently improve the display qualities.

Example 4-3

The evaluation result of the contrast was level 1 which was at a level suitable for use as a product. This is because in Example 4-3, the degree of alignment of the polymers was high, and thus the crossed Nicols luminance was low. Also, the VHR was 99%, which was at a level suitable for use as a product. Therefore, the method for manufacturing a liquid crystal display device according to Example 43 can sufficiently improve the display qualities.

Example 4-4

The evaluation result of the contrast was level 1 which was at a level suitable for use as a product. This is because in Example 4-4, the degree of alignment of the polymers was high, and thus the crossed Nicols luminance was low. Also, the VHR was 99%, which was at a level suitable for use as a product. Therefore, the method for manufacturing a liquid crystal display device according to Example 44 can sufficiently improve the display qualities.

Example 4-5

The evaluation result of the contrast was level 2 which was at a level suitable for use as a product. This is because in Example 4-5, the degree of alignment of the polymers was high, and thus the crossed Nicols luminance was low. Also, the VHR was 99%, which was at a level suitable for use as a product. Therefore, the method for manufacturing a liquid crystal display device according to Example 45 can sufficiently improve the display qualities.

Example 4-6

The evaluation result of the contrast was level 2 which was at a level suitable for use as a product. This is because in Example 4-6, the degree of alignment of the polymers was high, and thus the crossed Nicols luminance was low. Also, the VHR was 99%, which was at a level suitable for use as a product. Therefore, the method for manufacturing a liquid crystal display device according to Example 46 can sufficiently improve the display qualities.

The contrasts in Examples 4-1 to 4-4 were high compared to those in Examples 4-5 and 4-6 because of the following reasons. Too high a temperature for the pre-baking excessively volatilizes the solvent in the film of the liquid crystal alignment agent, decreasing the residual amount of the solvent after the pre-baking step. As a result, the mobility of the polymers by the photoalignment treatment decreases, and thus the degree of alignment of polymers does not increase. Meanwhile, pre-baking at low temperatures not affecting the photoalignment film qualities and display qualities leaves a relatively large residual amount of the solvent after the pre-baking step, which leads to a decrease in the density of the polymers relative to the total amount of the film of the liquid crystal alignment agent. As a result, the mobility of polymers by the photoalignment treatment increases, and thus the degree of alignment of polymers after the photoalignment treatment increases. Therefore, selecting the temperature for the pre-baking in Examples 4-1 to 4-4 (70° C. or lower) can provide better display qualities.

As described above, the preferred temperature for the pre-baking was found to be 70° C. or lower. When the temperature for the pre-baking is higher than 70° C., the residual amount of the solvent after the pre-baking step may be small, and thus the mobility of the polymers may not be sufficiently high. The temperature for the pre-baking is more preferably from 40° C. inclusive to 70° C. inclusive. When the temperature for the pre-baking is lower than 40° C., the convection flow of the solvent may give non-uniform thickness to the film, decreasing the display qualities. The time for the pre-baking is preferably from 30 seconds inclusive to 600 seconds inclusive. Here, the pre-baked film of the liquid crystal alignment agent is supposed to contain polymers (solids content) separated from the solvent (liquid phase). Too short a time for the pre-baking leads to an excessive residual amount of the solvent, giving non-uniform thickness to the film. Meanwhile, too long a time for the pre-baking may decrease the manufacturing efficiency.

Example 5-1

Example 5-1 is the case where the degree of polarization for the linearly polarized ultraviolet light in Example 1 was 5:1. Since the method for manufacturing a liquid crystal display device according to Example 5-1 is the same as that in Example 1 except for the photoirradiation step, description for the points that are the same as those in Example 1 is omitted.

(Photoirradiation Step)

The pre-baked film of the liquid crystal alignment agent on each of the two substrates was irradiated with linearly polarized ultraviolet light having a wavelength of 365 nm. The degree of polarization for the linearly polarized ultraviolet light was 5:1 at a wavelength of 365 nm. The irradiation with the linearly polarized ultraviolet light was performed from the normal direction to the substrates, and the irradiation amount thereof was 1000 mJ/cm² at a wavelength of 365 nm. The angle formed by the extension direction of the slits of the pixel electrodes on the glass substrate and the polarization direction of the linearly polarized ultraviolet light was 10°.

Example 5-2

Example 5-2 is the case where the degree of polarization for the linearly polarized ultraviolet light in Example 5-1 was 30:1 which is the same as that in Example 1. Since the method for manufacturing a liquid crystal display device according to Example 5-2 is the same as that in Example 1, description for the points that are the same as those in Example 1 is omitted.

Example 5-3

Example 53 is the case where the degree of polarization for the linearly polarized ultraviolet light in Example 5-1 was 700:1. Since the method for manufacturing a liquid crystal display device according to Example 53 is the same as that in Example 5-1 except for the photoirradiation step, description for the points that are the same as those in Example 5-1 is omitted.

(Photo-Irradiation Step)

The pre-baked film of the liquid crystal alignment agent on each of the two substrates was irradiated with linearly polarized ultraviolet light having a wavelength of 365 nm. The degree of polarization for the linearly polarized ultraviolet light was 700:1 at a wavelength of 365 nm. The irradiation with the linearly polarized light was performed from the normal direction to the substrates, and the irradiation amount thereof was 1000 mJ/cm² at a wavelength of 365 nm. The angle formed by the extension direction of the slits of the pixel electrodes on the glass substrate and the polarization direction of the linearly polarized ultraviolet light was 10°.

Evaluation Results

Examples 5-1 to 5-3

The degree of polarization for the linearly polarized ultraviolet light and the evaluation results of the contrast and the VHR of each liquid crystal display device manufactured by the method for manufacturing a liquid crystal display device according to one of Examples 5-1 to 5-3 are summarized in Table 4. Here, the contrast and the VHR were measured and evaluated by the same methods as those in Examples 2-1 to 2-7.

TABLE 4

| | Degree of polarization for linearly polarized ultraviolet light | Evaluation result | |
|---|---|---|---|
| | | Contrast | VHR (%) |
| Example 5-1 | 5:1 | Level 2 | 99 |
| Example 5-2 | 30:1 | Level 1 | 99 |
| Example 5-3 | 700:1 | Level 1 | 99 |

Example 5-1

The evaluation result of the contrast was level 2 which was at a level suitable for use as a product. This is because in Example 5-1, the degree of alignment of the polymers was high, and thus the crossed Nicols luminance was low. Also, the VHR was 99%, which was at a level suitable for use as a product. Therefore, the method for manufacturing a liquid crystal display device according to Example 5-1 can sufficiently improve the display qualities.

Example 5-2

The evaluation result of the contrast was level 1 which was at a level suitable for use as a product. This is because in Example 5-2, the degree of alignment of the polymers was high, and thus the crossed Nicols luminance was low. Also, the VHR was 99%, which was at a level suitable for use as a product. Therefore, the method for manufacturing a liquid crystal display device according to Example 5-2 can sufficiently improve the display qualities.

Example 5-3

The evaluation result of the contrast was level 1 which was at a level suitable for use as a product. This is because in Example 5-3, the degree of alignment of the polymers was high, and thus the crossed Nicols luminance was low. Also, the VHR was 99%, which was at a level suitable for use as a product. Therefore, the method for manufacturing a liquid crystal display device according to Example 5-3 can sufficiently improve the display qualities.

The contrasts in Examples 5-2 and 5-3 were high compared to that in Example 5-1 because of the following reasons. In Examples 5-2 and 5-3, the degree of polarization for the linearly polarized ultraviolet light in the photoirradiation step is high and the anisotropy of the polymers right after the photoirradiation is increased compared to the case of Example 5-1, and thereby the degree of alignment of the polymers is further increased through the following steps.

As described above, the preferred degree of polarization for the linearly polarized ultraviolet light was found to be 30:1 or more at a wavelength of 365 nm. When the degree of polarization for linearly polarized ultraviolet light is less than 30:1, the anisotropy of the polymers right after the photoirradiation may not sufficiently increase.

Example 6

Example 6 is the case where the post-baking in Example 1 was performed in three steps at three different temperatures. Since the method for manufacturing a liquid crystal display device according to Example 6 is the same as that in Example 1 except for the post-baking step, description for the points that are the same as those in Example 1 is omitted.

(Post-Baking Step)

Figure 19:
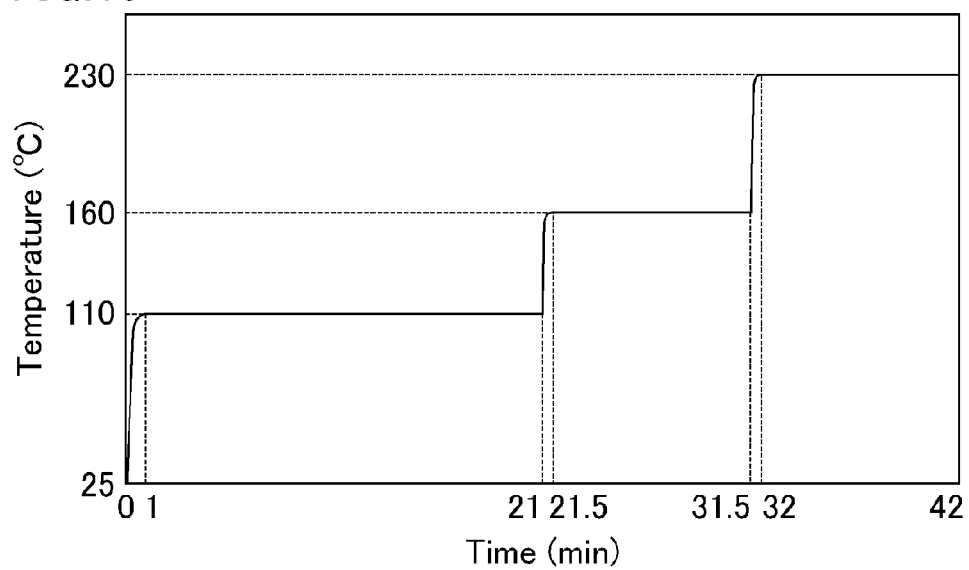
FIG. 19 is a graph showing a temperature profile for post-baking in Example 6.

The post-baking was performed on the irradiated film of the liquid crystal alignment agent on each of the two substrates with a temperature profile shown in FIG. 19. FIG. 19 is a graph showing a temperature profile for post-baking in Example 6. The substrates were placed on a 110° C. hot plate. As shown in FIG. 19, the temperature of the substrates increased from room temperature (25° C.) to 110° C. over 1 minute, and then the first post-baking was performed at 110° C. for 20 minutes. Thereafter, the substrates were placed on a separately prepared 160° C. hot plate. As shown in FIG. 19, the temperature of the substrates increased from 110° C. to 160° C. over 0.5 minutes, and then the second post-baking was performed at 160° C. for 10 minutes. The substrates were then placed on a separately prepared 230° C. hot plate. As shown in FIG. 19, the temperature of the substrates increased from 160° C. to 230° C. over 0.5 minutes, and then the third post-baking was performed at 230° C. for 10 minutes. Thereby, a horizontal alignment film was formed on each of the substrates.

Evaluation Result

Example 6

The contrast and the VHR of the liquid crystal display device manufactured by the method for manufacturing a liquid crystal display device according to Example 6 were measured by the same methods as those in Example 1. The evaluation results of Example 6 are described below.

The contrast was 1800 or higher which was at a level suitable for use as a product. This is because in Example 6, the degree of alignment of the polymers was high, and thus the crossed Nicols luminance was low. Also, the VHR was 99% or higher, which was at a level suitable for use as a product. Therefore, the method for manufacturing a liquid crystal display device according to Example 6 can sufficiently improve the display qualities. The takt time for the post-baking step in Example 6 is the same as that for the post-baking step in Comparative Example 1, and thus the method for manufacturing a liquid crystal display device according to Example 6 can increase the degree of alignment of the polymers without changing the takt time.

As described above, the display qualities were found to be sufficiently increased also in the case of performing the post-baking in three steps at three different temperatures. Of course, the effect of the present invention can be achieved also in the case that the post-baking is stepwise performed at three or more different temperatures for an increase in the degree of alignment of polymers.

Example 7

Example 7 is the case where the post-baking in Example 1 was performed at two steps while the temperature was being increased. Since the method for manufacturing a liquid crystal display device according to Example 7 is the same as that in Example 1 except for the post-baking step, description for the points that are the same as those in Example 1 is omitted.
(Post-Baking Step)

Figure 20:
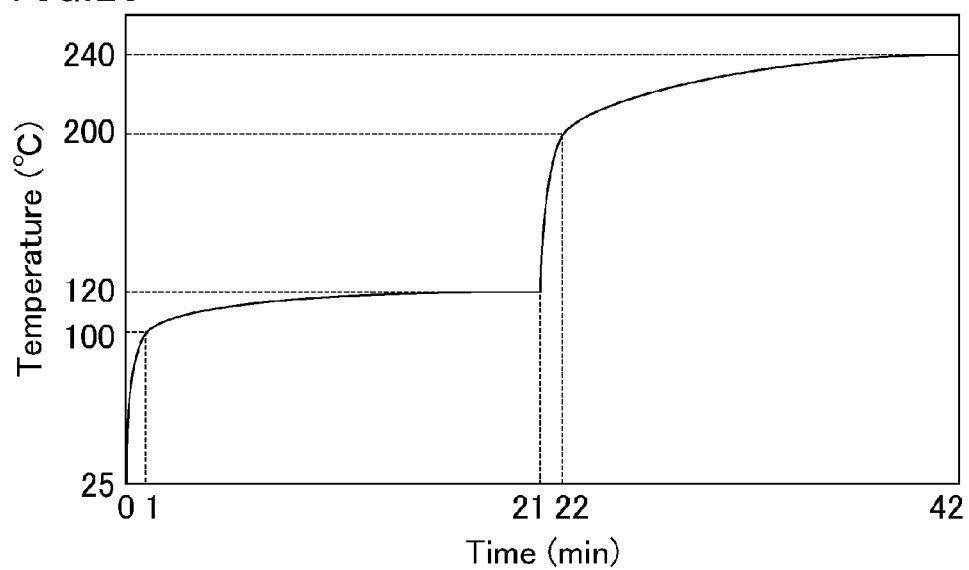
FIG. 20 is a graph showing a temperature profile for post-baking in Example 7.

The post-baking was performed on the irradiated film of the liquid crystal alignment agent on each of the two substrates with a temperature profile shown in FIG. 20.

FIG. 20 is a graph showing a temperature profile for post-baking in Example 7. The substrates were placed on a 100° C. hot plate. As shown in FIG. 20, the temperature of the substrates increased from room temperature (25° C.) to 100° C. over 1 minute, and then the first post-baking where the temperature was increased from 100° C. to 120° C. over 20 minutes (temperature increase rate: 1° C./min) was performed. Thereafter, the substrates were placed on a separately prepared 200° C. hot plate. As shown in FIG. 20, the temperature of the substrates increased from 120° C. to 200° C. over 1 minute, and then the second post-baking where the temperature was increased from 200° C. to 240° C. over 20 minutes (temperature increase rate: 2° C./min) was performed. Thereby, a horizontal alignment film was formed on each of the substrates.

Evaluation Result

Example 7

The contrast and the VHR of the liquid crystal display device manufactured by the method for manufacturing a liquid crystal display device according to Example 7 were measured by the same methods as those in Example 1. The evaluation results of Example 7 are described below.

The contrast was 1800 or higher which was at a level suitable for use as a product. This is because in Example 7, the degree of alignment of the polymers was high, and thus the crossed Nicols luminance was low. Also, the VHR was 99% or higher, which was at a level suitable for use as a product. Therefore, the method for manufacturing a liquid crystal display device according to Example 7 can sufficiently improve the display qualities. The takt time for the post-baking step in Example 7 is the same as that for the post-baking step in Comparative Example 1, and thus the method for manufacturing a liquid crystal display device according to Example 7 can increase the degree of alignment of the polymers without changing the takt time.

As described above, the display qualities were found to be sufficiently increased also in the case that the post-baking is performed at two steps while the temperature is being increased. Of course, the effect of the present invention can be achieved also in the case that the post-baking is performed at three or more steps while the temperature is being increased, for an increase in the degree of alignment of polymers. Of course, the effect of the present invention can be achieved also in the case that the post-baking is performed at two or more steps while the temperature is being decreased.

Example 8

Example 8 is the case where in Example 1, an active matrix substrate including thin film transistors was used as the glass substrate having an FFS-mode electrode structure, a color filter substrate was used as the counter substrate, and also a liquid crystal material including liquid crystal molecules having negative anisotropy of dielectric constant was used. Since the method for manufacturing a liquid crystal display device according to Example 8 is the same as that in Example 1 except for the above differences, description for the points that are the same as those in Example 1 is omitted. Here, the liquid crystal material used had an anisotropy ΔE of dielectric constant of −4 and an anisotropy Δn of refractive index of 0.1

Evaluation Result

Example 8

The contrast of the liquid crystal display device manufactured by the method for manufacturing a liquid crystal display device according to Example 8 was measured by the same method as that in Example 1. The evaluation results of Example 8 are described below.

The contrast was 1800 or higher which was at a level suitable for use as a product. This is because in Example 8, the degree of alignment of the polymers was high, and thus the crossed Nicols luminance was low. Therefore, the method for manufacturing a liquid crystal display device according to Example 8 can sufficiently improve the display qualities.

As described above, the display qualities were found to be sufficiently increased also in the case of changing the substrates used and the liquid crystal material used. Of course, the effect of the present invention can be achieved even in the case that either one of the substrates and the liquid crystal material used is changed.

When an IPS-mode or FFS-mode liquid crystal display device is under active driving, the transmittance in white display in the case of liquid crystal molecules having negative anisotropy of dielectric constant is high compared to the case of liquid crystal molecules having positive anisotropy of dielectric constant. This is because liquid crystal molecules having negative anisotropy of dielectric constant are not affected by the electric field components vertical to the substrate faces. Accordingly, the transmittance loss attributed to the rise of the liquid crystal molecules from the substrate plane is reduced. Hence, from the viewpoint of increasing the white transmittance, liquid crystal molecules having negative anisotropy of dielectric constant are preferred.

Although the above examples showed the cases where the post-baking was performed using multiple hot plates set at different temperatures, the post-baking can be performed using a single hot plate by sequentially changing the temperature to different temperatures. When a single hot plate is used, the installation area for the heating device can be further reduced, which increases the degree of freedom of the layout for the device. In contrast, use of multiple hot plates increases the installation area for the heating devices, but can eliminate the time for decreasing the temperature of the hot plate to the starting temperature after the post-baking step which is required in the case of using a single hot plate. Thereby, the manufacturing efficiency can be further increased. In the case that multiple hot plates are used, the temperature of the substrates may decrease when the substrates are transported from one hot plate to another hot plate, but this would not be any disadvantage in achieving the object of the present invention.

Although the above examples are the cases using an FFS-mode liquid crystal display device, the effect of the present invention can also be achieved in the case of using an IPS-mode liquid crystal display device having the same horizontal alignment film.

[Remarks]

Examples of preferred embodiments for the method for manufacturing a liquid crystal display device according to the present invention are described below. The above structures may be appropriately combined as long as the combination does not go beyond the scope of the present invention.

The solvent may contain butyl cellosolve and/or N-methyl-pyrrolidone. The solvent may also contain other compound(s) selected from the group consisting of N-ethyl-pyrrolidone, γ-butyl lactone, diethylene glycol diethylether, diisobutyl ketone and its structural isomers, propylene glycol monobutyl ether, and diacetone alcohol.

The step (4) may be performed with multiple heating devices set at respective different temperatures. Thereby, the operation of post-baking the film of the liquid crystal alignment agent can suitably be performed multiple times at temperatures ranging from low to high temperatures. Also, compared to the case of using a single heating device, the manufacturing efficiency can be further increased.

The step (4) may be performed by sequentially changing the temperature to different temperatures using a single heating device. Thereby, the operation of post-baking the film of the liquid crystal alignment agent can suitably be performed multiple times at temperatures ranging from low to high temperatures. Also, compared to the case of using multiple heating devices, the installation area for the heating device can be further reduced, and thus the degree of freedom of the layout for the device can be increased.

The step (4) may include an operation of post-baking in a stepwise manner in order to have a plurality of periods of different constant temperatures. Thereby, the post-baking can be stepwisely performed at different temperatures, and the post-baking can be performed with a manipulated temperature profile. Here, the periods of constant temperatures may each refer to the period in which, for example, the heating is maintained within a temperature range of ±5° C. for one minute or more.

The post-baking in the step (4) may be performed at two temperatures of a first temperature and a second temperature that is higher than the first temperature. Thereby, the post-baking can be performed in two steps at two different temperatures.

The post-baking in the step (4) may be performed at three temperatures which are a first temperature, a second temperature that is higher than the first temperature, and a third temperature that falls between the first temperature and the second temperature. Thereby, the post-baking can be performed in three steps at three different temperatures.

The first temperature may be from 80° C. inclusive to 140° C. inclusive, and is more preferably from 100° C. inclusive to 120° C. inclusive. Thereby, the mobility of the polymers is sufficiently increased, so that the degree of alignment of the polymers can be sufficiently increased. When the first temperature is lower than 80° C., the mobility of the polymers may possibly decrease, whereas when the first temperature is higher than 140° C., the polymers may possibly be gradually imidized.

The second temperature may be 180° C. or higher, more preferably 200° C. or higher, and particularly preferably from 200° C. inclusive to 250° C. inclusive. Thereby, imidization of the polymers sufficiently proceeds, so that the degree of alignment can be fixed at a high level. When the second temperature is lower than 180° C., the imidization of the polymers may be insufficient.

The first temperature may be from 100° C. inclusive to 120° C. inclusive, and the second temperature may be 200° C. or higher. Thereby, the mobility of the polymers is sufficiently increased, so that the degree of alignment of the polymers can be sufficiently increased. The imidization of the polymers then proceeds sufficiently, whereby the degree of alignment can be fixed at a high level.

The post-baking in the step (4) may be performed in two steps at two different temperatures, with a first post-baking temperature sequentially changed in the range from 100° C. inclusive to 120° C. inclusive, and a second post-baking temperature sequentially changed in the range of 200° C. or higher. Thereby, the mobility of the polymers is sufficiently increased, so that the degree of alignment of the polymers can be sufficiently increased. The imidization of the polymers then proceeds sufficiently, whereby the degree of alignment can be fixed at a high level.

The pre-baking in the step (2) may be performed at a temperature in the range of 70° C. or lower, or more preferably at a temperature ranging from 40° C. inclusive to 70° C. inclusive. Thereby, the mobility of the polymers increases sufficiently by the photoalignment treatment, which increases the degree of alignment of polymers sufficiently after the photoalignment treatment.

The light irradiated in the step (3) may be linearly polarized light with a degree of polarization of 5:1 or more, preferably be linearly polarized light with a degree of polarization of 30:1 or more. Thereby, the degree of alignment of the polymers after the photoalignment treatment can be sufficiently increased. When the degree of polarization is less than 5:1, the anisotropy of the polymers right after the photoirradiation may not increase.

The invention claimed is:

1. A method for manufacturing a liquid crystal display device,
the liquid crystal display device comprising
a pair of substrates and a photoalignment film disposed on at least one of the substrates, the photoalignment film formed from a liquid crystal alignment agent, and aligning liquid crystal molecules horizontally to the main face of the at least one of the substrates, the liquid crystal alignment agent containing a solvent and at least two kinds of polyamic acids or their derivatives, the at least two kinds of polyamic acids or their derivatives including a compound obtained by reacting at least a diamine represented by the following chemical formula (1-1) and a first tetracarboxylic dianhydride, and a compound obtained by reacting at least a diamine represented by the following chemical formula (1-2) and a second tetracarboxylic dianhydride, at least one of the first and second tetracarboxylic dianhydrides being a compound represented by the following chemical formula (2), the method comprising, in the following order, the steps of:
(1) forming the film of the liquid crystal alignment agent on the at least one of the substrates;
(2) pre-baking the film of the liquid crystal alignment agent formed on the at least one of the substrates;
(3) irradiating the pre-baked film of the liquid crystal alignment agent with light; and
(4) post-baking the irradiated film of the liquid crystal alignment agent, the step (4) including an operation of post-baking the film of the liquid crystal alignment agent multiple times at temperatures ranging from low to high temperatures, the chemical formulas (1-1) and (1-2) being

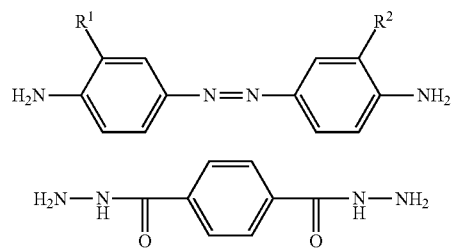

wherein $R^1$ and $R^2$ are each independently —$CH_3$ or a hydrogen atom, the chemical formula (2) being

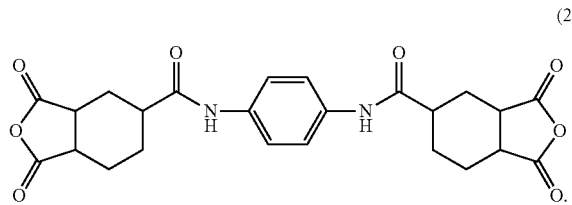

2. The method for manufacturing a liquid crystal display device according to claim 1,
wherein the solvent contains butyl cellosolve and/or N-methyl-pyrrolidone.

3. The method for manufacturing a liquid crystal display device according to claim 1,
wherein the step (4) is performed with multiple heating devices set at respective different temperatures.

4. The method for manufacturing a liquid crystal display device according to claim 1,
wherein the step (4) includes an operation of post-baking in a stepwise manner in order to have a plurality of periods of different constant temperatures.

5. The method for manufacturing a liquid crystal display device according to claim 4,
wherein the post-baking in the step (4) is performed at two temperatures of a first temperature and a second temperature that is higher than the first temperature.

6. The method for manufacturing a liquid crystal display device according to claim 5,
wherein the first temperature is from 100° C. inclusive to 120° C. inclusive.

7. The method for manufacturing a liquid crystal display device according to claim 5,
wherein the second temperature is 200° C. or higher.

8. The method for manufacturing a liquid crystal display device according to claim 5,
wherein the first temperature is from 100° C. inclusive to 120° C. inclusive, and the second temperature is 200° C. or higher.

9. The method for manufacturing a liquid crystal display device according to claim 4,
wherein the post-baking in the step (4) is performed at three temperatures which are a first temperature, a second temperature that is higher than the first temperature, and a third temperature that falls between the first temperature and the second temperature.

10. The method for manufacturing a liquid crystal display device according to claim 9,
wherein the first temperature is from 100° C. inclusive to 120° C. inclusive.

11. The method for manufacturing a liquid crystal display device according to claim 9,
wherein the second temperature is 200° C. or higher.

12. The method for manufacturing a liquid crystal display device according to claim 9,
wherein the first temperature is from 100° C. inclusive to 120° C. inclusive, and the second temperature is 200° C. or higher.

13. The method for manufacturing a liquid crystal display device according to claim 1,
wherein the pre-baking in the step (2) is performed at a temperature in the range of 70° C. or lower.

14. The method for manufacturing a liquid crystal display device according to claim 1,
wherein the light irradiated in the step (3) is linearly polarized light with a degree of polarization of 30:1 or more.

15. A liquid crystal display device in a liquid crystal display mode of the IPS mode or the FFS mode,
the device manufactured by the method for manufacturing a liquid crystal display device according to claim 1.

* * * * *